United States Patent [19]

Hiiro

[11] Patent Number: 5,661,747
[45] Date of Patent: *Aug. 26, 1997

[54] LASER APPARATUS

[75] Inventor: Hiroyuki Hiiro, Kanagawa-ken, Japan

[73] Assignee: Fuji Photo Film Co., Ltd., Kanagawa-ken, Japan

[*] Notice: The term of this patent shall not extend beyond the expiration date of Pat. No. 5,600,666.

[21] Appl. No.: 365,010

[22] Filed: Dec. 28, 1994

[30] Foreign Application Priority Data

Dec. 28, 1993 [JP] Japan ................... 5-336318
Jul. 6, 1994 [JP] Japan ................... 6-154737
Oct. 14, 1994 [JP] Japan ................... 6-249615

[51] Int. Cl.$^6$ .................................................. H01S 3/08
[52] U.S. Cl. ................. 372/101; 372/108; 372/98; 372/92
[58] Field of Search ...................... 372/92, 101, 108, 372/98

[56] References Cited

U.S. PATENT DOCUMENTS

| | | |
|---|---|---|
| 4,185,891 | 1/1980 | Kaestner ................... 359/619 |
| 4,246,548 | 1/1981 | Rutz . | 
| 4,649,351 | 3/1987 | Veldkamp et al. . |
| 4,813,762 | 3/1989 | Leger et al. . |
| 4,972,427 | 11/1990 | Streifer et al. . |
| 5,139,609 | 8/1992 | Fields ................... 359/619 |
| 5,319,496 | 6/1994 | Jewell et al. ................... 359/619 |

OTHER PUBLICATIONS

David Mehuys et al.; "Modal analysis of linear Talbot–cavity semiconductor lasers", Jun. 1, 1991; vol. 16, No. 11; pp. 823–825.

*Primary Examiner*—Leon Scott, Jr.

[57] ABSTRACT

A laser apparatus comprises a plurality of laser beam sources for radiating out a plurality of laser beams such that the laser beams may intersect one another on a predetermined virtual plane, through which the laser beams pass. A Fourier transform lens array optical system, which divides the laser beams having impinged upon the virtual plane into small regions and carries out Fourier transform of the small regions, is located in the vicinity of the virtual plane. A laser resonator mirror optical system is constituted of a first laser resonator mirror, which is located at a position that receives the laser beams having been radiated out of the Fourier transform lens array optical system, and a second laser resonator mirror, which is located at a position rearward from the laser beam sources. The laser apparatus coherently combines the later beams with one another without reducing the radiant energy combining efficiency and thereby radiates out a combined laser beam having a high output power.

8 Claims, 13 Drawing Sheets

F I G. 13
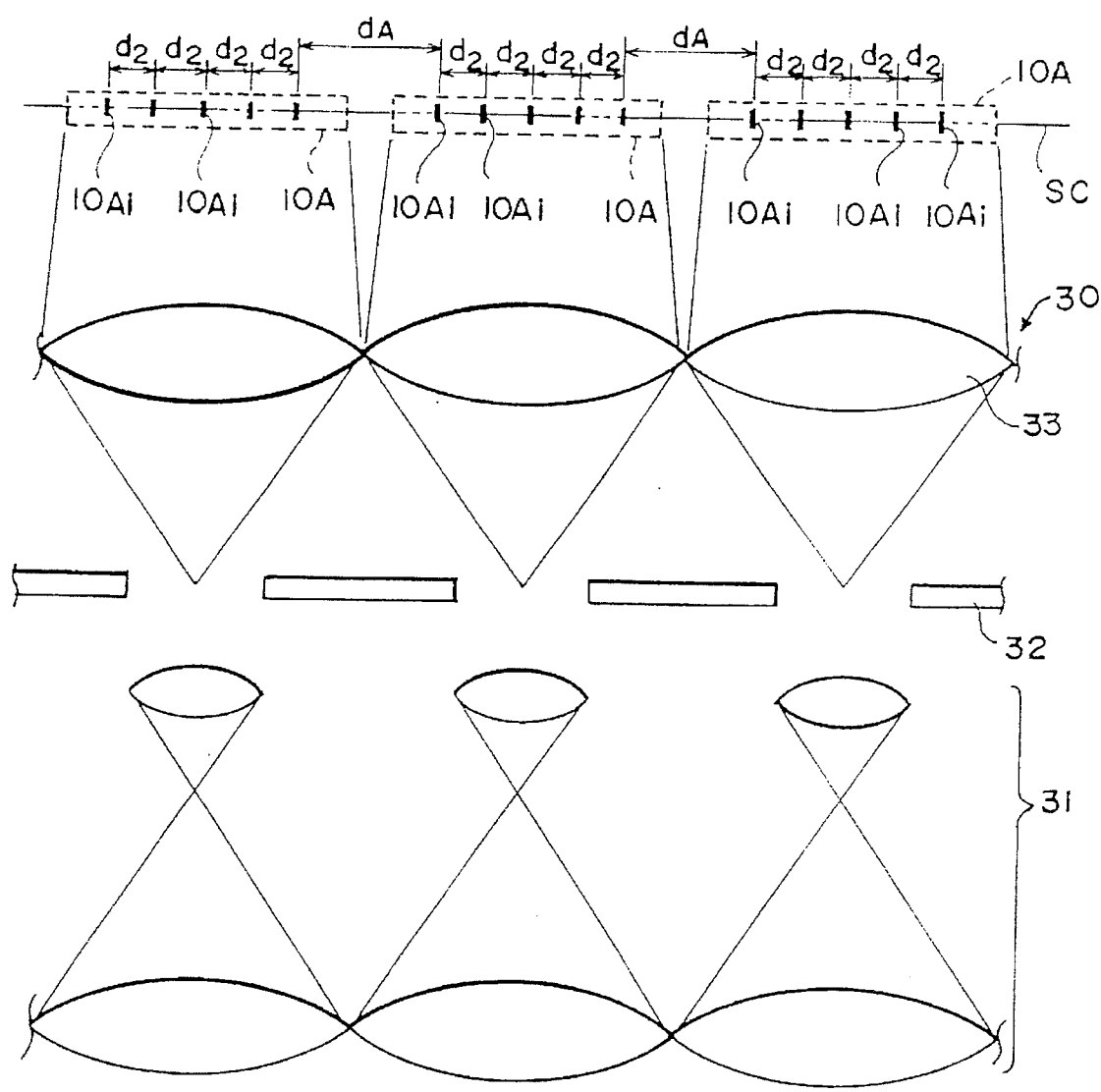

1

LASER APPARATUS

BACKGROUND OF THE INVENTION

1. Field of the Invention

This invention relates to a laser apparatus. This invention particularly relates to an external resonator type of laser apparatus, which has a high output power and which is used in order to record or read out information.

2. Description of the Prior Art

Lasers have heretofore been used as scanners, and the like, in various fields in order to read out information from media, on which the information has been recorded, or to record information on recording media. The lasers are required to have a higher output power. However, the output power of a single laser device is limited to a certain level. Therefore, laser apparatuses have heretofore been used, in which a plurality of laser devices are arrayed in a one-dimensional pattern or a two-dimensional pattern, laser beams radiated out of the laser devices are combined with one another, and a combined laser beam having a high output power is thereby obtained.

As such laser apparatuses, external resonator type of laser apparatuses have been disclosed in, for example, Japanese Unexamined Patent Publication No. 58(1983)-16350 and U.S. Pat. Nos. 4,813,762 and 4,649,351. For example, the external resonator type of laser apparatus, which is disclosed in Japanese Unexamined Patent Publication No. 58(1983)-16350, comprises a plurality of laser devices, which are located in a resonator structure constituted of a spherical lens and a plane mirror, and a spatial mode filter, which is located in the resonator structure and which attenuates the modes other than the lowest-order transverse mode. With the interference effects given by the spatial mode filter, the laser beams having been produced by the plurality of the laser devices are combined with one another and radiated with the same phase, and a combined laser beam having a high output power is thereby obtained.

With the technique disclosed in U.S. Pat. No. 4,649,351, it is necessary to use a special phase grating for splitting each of a plurality of laser beams, which are to be combined with one another, into the same number of laser beams as that of the plurality of the laser beams, which are to be combined with one another, such that the split laser beams may have an equal intensity. It is necessary for the phase grating to be designed optimally such that the intensity distribution of the laser beam having been combined on the phase grating may become uniform and the beam combining efficiency may thereby be kept high. Therefore, if the number of the laser beams to be combined with one another becomes large, it will become difficult to design the phase grating optimally such that the intensities of the split laser beams may be kept equal to one another, and such that the intensity distribution of the laser beam having been combined on the phase grating may become uniform. Thus the disclosed technique has the drawbacks in that the beam combining efficiency cannot be kept high.

With the technique disclosed in U.S. Pat. No. 4,813,762, if the number of the laser beams to be combined with one another becomes large, the discrimination between the oscillation eigen modes (super modes), in which the laser beam is radiated, will become low, and therefore the laser beam will become apt to be radiated in a plurality of kinds of eigen modes. Accordingly, it will become difficult to radiate the laser beam only in the eigen modes, in which the laser beam is radiated with the same phase. Such problems have also been pointed out in, for example, "Modal Analysis of Linear Talbot-Cavity Semiconductor Lasers" by David Mehuys, William Streifer, Robert G. Waarts, and David F. Welch, OPTICS LETTERS/VOL. 16, NO. 11/JUNE 1991.

SUMMARY OF THE INVENTION

The primary object of the present invention is to provide a laser apparatus, which coherently combines a plurality of laser beams with one another without reducing the radiant energy combining efficiency and thereby radiates out a combined laser beam having a high output power.

Another object of the present invention is to provide a laser apparatus, which consistently radiates out only a laser beam in a predetermined eigen mode and having the same phase.

A further object of the present invention is to provide a laser apparatus, which produces a combined laser beam having good single-lobed characteristics.

The present invention provides a laser apparatus comprising:

i) a plurality of laser beam sources for radiating out a plurality of laser beams such that the laser beams may intersect one another on a predetermined virtual plane, through which the laser beams pass, ii) a Fourier transform lens array optical system, which is located in the vicinity of the virtual plane, and which divides the laser beams having impinged upon the virtual plane into small regions and carries out Fourier transform of the small regions, and iii) a laser resonator mirror optical system comprising:

a) a first laser resonator mirror, which is located at a position that receives the laser beams having been radiated out of the Fourier transform lens array optical system, and b) a second laser resonator mirror, which is located at a position rearward from the laser beam sources.

With the laser apparatus in accordance with the present invention, a coherent combined laser beam can be obtained. As described above, the Fourier transform lens array optical system is located in the vicinity of the virtual plane. This means that the Fourier transform lens array optical system is located such that its Fourier transform plane and the virtual plane may be close to each other or may coincide with each other.

In the laser apparatus in accordance with the present invention, the focal length of the Fourier transform lens array optical system, the array pitch of the Fourier transform lens array optical system, the number of the plurality of the laser beam sources, the wavelength of the laser beams, and the variation of the angular spectrum of each of the laser beams at the respective positions, at which the laser beams intersect one another, may be set such that a plurality of Fourier transformed patterns of the laser beams, which patterns are reproduced on the Fourier transform plane of the Fourier transform lens array optical system, may stand in a line at a predetermined pitch as a whole. In such cases, a coherent combined laser beam having a single wave front can be obtained. The term "predetermined pitch" as used herein also embraces the cases wherein the Fourier transformed patterns stand in a line at an equal pitch.

Also, in the laser apparatus in accordance with the present invention, the value of the product of the array pitch of the Fourier transform lens array optical system and the variation of the angular spectrum of each of the laser beams at the respective positions, at which the laser beams intersect one another, may be set to be equal to 1 such that the intensity distribution pattern of the combined laser beam, which occurs from optical coupling of the plurality of the laser beams, may become approximately perfectly single-lobed. In such cases, a coherent combined laser beam having the same phase and a high output power can be obtained.

Further, in the laser apparatus in accordance with the present invention, the value of the product of the array pitch of the Fourier transform lens array optical system and the variation of the angular spectrum of each of the laser beams may be set to be equal to a value, which falls within the range of larger than 0 to smaller than 2 and which is other than 1, and the laser apparatus may further be provided with a phase correcting means, which corrects each of the phases of the laser beams passing through a plurality of Fourier transform lens optical systems constituting the Fourier transform lens array optical system, such that the wave fronts of the laser beams after having passed through the plurality of the Fourier transform lens optical systems may be smoothly connected with one another as a whole, whereby the intensity distribution pattern of the combined laser beam, which occurs from optical coupling of the plurality of the laser beams, is rendered approximately perfectly single-lobed.

With the laser apparatus provided with the phase correcting means in accordance with the present invention, the laser beams having the wave fronts connected smoothly with one another are propagated such that they may be converged at a point on the optical axis. Therefore, the laser apparatus is advantageous in that the combined laser beam is radiated as a convergent beam out of the laser apparatus, and a converging lens need not be used.

Furthermore, in the laser apparatus in accordance with the present invention, the plurality of the laser beam sources may be located in a skew lattice pattern in a two-dimensional plane normal to the optical axis, and the plurality of the Fourier transform lens optical systems constituting the Fourier transform lens array optical system may be arrayed in the reciprocal lattice pattern in accordance with the skew lattice pattern of the laser beam sources.

The term "locating in a skew lattice pattern" as used herein means that the laser beam sources are located in a skew periodic pattern at predetermined intervals in each of two directions on a predetermined skew coordinate system.

In general, the laser beam sources may be located at points on a skew lattice given as the solutions of the simultaneous equations of Formulas (24) and (25) on an orthogonal x-y coordinate system.

$$a_1 x + b_1 y = n_1 \quad n_1: \text{an integer} \quad (24)$$

$$a_2 x + b_2 y = n_2 \quad n_2: \text{an integer} \quad (25)$$

where $$a_1 = \frac{\alpha}{d_1 \sqrt{1+\alpha^2}}, \quad b_1 = \frac{-1}{d_1 \sqrt{1+\alpha^2}}$$

$d_1$: the orthogonal distance between the skew lattice axes represented by Formula (24)

$\alpha$: the inclination of Formula (24) with respect to the x axis $a_2 = 0, b_2 = -1/d_2$ $d_2$: the orthogonal distance between the skew lattice axes represented by Formula (25)

The term "reciprocal lattice pattern in accordance with a skew lattice pattern" as used herein means the pattern of the points on the lattice given as the solutions of the simultaneous equations of Formulas (27) and (28) on an orthogonal $u_1$–$u_2$ coordinate system, which is obtained from Fourier transform of the orthogonal x-y coordinate system.

$$-\frac{b_1}{\Delta} \cdot \frac{u_1}{\lambda f_1} + \frac{a_1}{\Delta} \cdot \frac{u_2}{\lambda f_1} = J_1 \quad J_1: \text{an integer} \quad (27)$$

$$\frac{b_2}{\Delta} \cdot \frac{u_1}{\lambda f_1} - \frac{a_2}{\Delta} \cdot \frac{u_2}{\lambda f_1} = J_2 \quad J_2: \text{an integer} \quad (28)$$

$$\Delta = a_1 b_2 - a_2 b_1$$

With the laser apparatus in accordance with the present invention, interfered light is generated on the front Fourier transform plane of the Fourier transform lens array optical system by the plurality of the laser beams. The interference pattern of the interfered light has periodic peaks. The interval between the adjacent peaks is determined by the variation of the angular spectrum of each of the laser beams, which are to be combined with one another. Also, as the number of the laser beams to be combined with one another becomes larger, the width of the intensity, which occupies the peak, becomes smaller, and the level of the peak intensity becomes higher. Therefore, by the use of a lens array having a sufficiently large numerical aperture, even if a large number of laser beams are combined with one another, the radiant energy combining efficiency can be kept high, and a combined laser beam having a high output power can thereby be radiated out.

Further, the laser beams to be combined with one another are coupled in parallel, and the difference between the value of the power threshold gain of a laser beam, which is radiated in a predetermined eigen mode and with the same phase, and the value of the power threshold gain of a laser beam in the other eigen mode can be kept large regardless of the number of the laser beams to be combined with one another. Therefore, only the laser beam in the predetermined eigen mode and having the same phase can be selected easily and can be consistently radiated out.

Moreover, with the laser apparatus in accordance with the present invention, wherein the value of the product of the array pitch of the Fourier transform lens array optical system and the variation (i.e., the difference) of the angular spectrum of each of the laser beams is set to be equal to 1, side lobes occurring on opposite sides of the center lobe in the light intensity distribution, which is illustrated in, for example, FIG. 5 in the specification of U.S. Pat. No. 4,813,762, can be kept small. Thus a combined laser beam having good single-lobed characteristics can be obtained.

BRIEF DESCRIPTION OF THE DRAWINGS

FIG. 13 is an explanatory view showing how the near field patterns of the array laser are arrayed at an equal pitch as a whole.

DESCRIPTION OF THE PREFERRED EMBODIMENTS

The present invention will hereinbelow be described in further detail with reference to the accompanying drawings.

The analyses described below are premised on assumptions (i), (ii), (iii), and (iv).

(i) Each of the lasers constituting an array laser oscillates in a single longitudinal and transverse mode.

(ii) Each of the lasers constituting the array laser produces an Airy beam.

(iii) Laser beams produced by the lasers constituting the array laser are coupled with one another only by the coupling effects of a round trip in a resonator.

(iv) Return light, which has been partially reflected by a resonator mirror, is distributed by a Fourier transform lens array optical system to the respective lasers, which constitute the array laser, such that no loss of radiant energy and no phase difference may occur.

Figure 1:
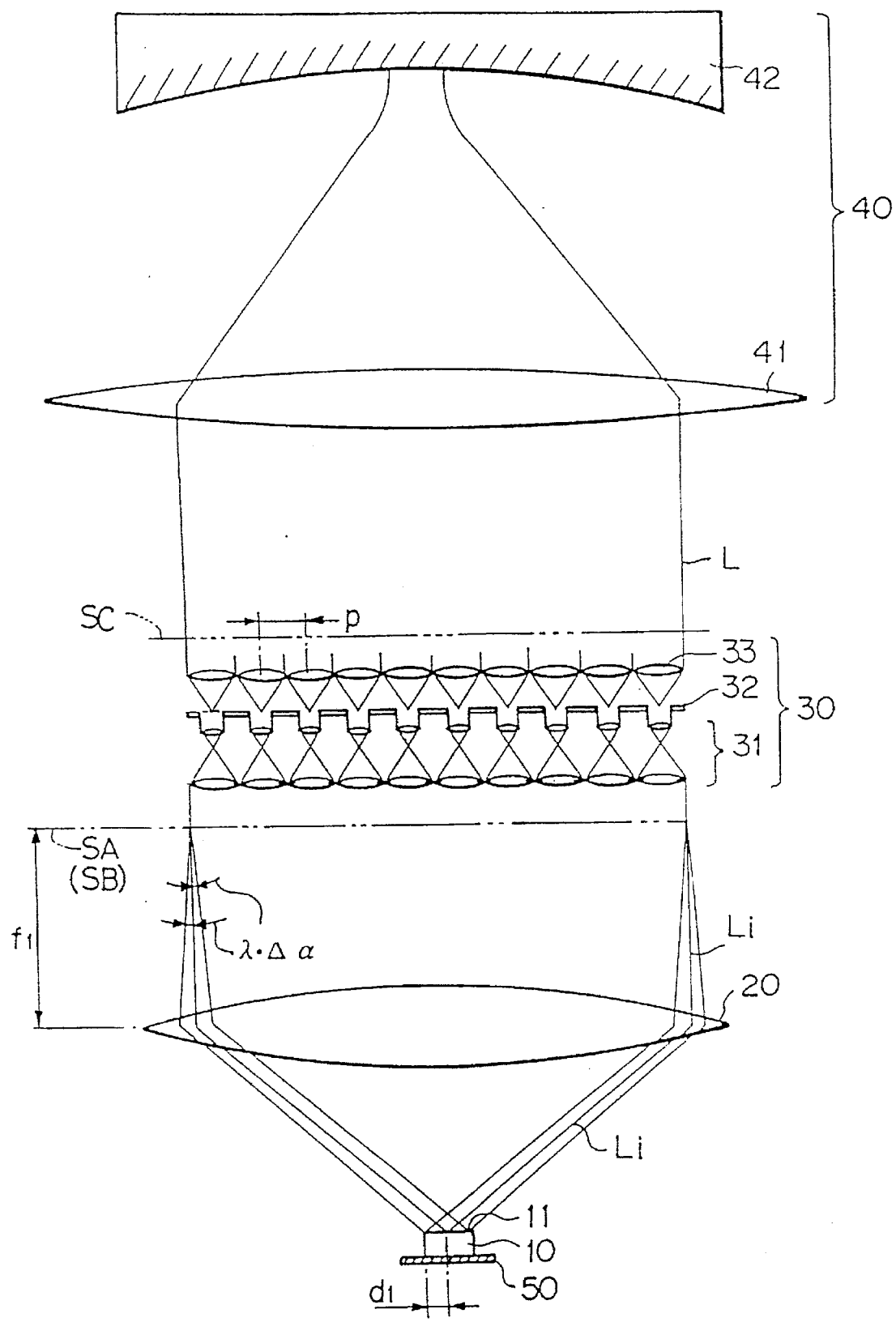
FIG. 1 is a schematic view showing a first embodiment of the laser apparatus in accordance with the present invention.

FIG. 1 is a schematic view showing a first embodiment of the laser apparatus in accordance with the present invention. With reference to FIG. 1, the laser apparatus comprises an array laser 10 composed of N number of laser beam sources 11, 11, . . . , which produce coherent laser beams Li having a wavelength λ and which are located in a two-dimensional pattern at a pitch $d_1$. The laser apparatus also comprises a Fourier transform lens 20, which has a focal length $f_1$ and is located so as to stand facing the array laser 10. The laser apparatus further comprises a Fourier transform lens array optical system 30, which is located on a Fourier transform plane SA of the Fourier transform lens 20 and which divides far field patterns or the array laser 10 into small regions. The Fourier transform lens array optical system 30 is composed of a beam expander array (an expander lens array) 31, an aperture array 32, and a Fourier transform lens array 33. The laser apparatus still further comprises a resonator mirror optical system 40, which is constituted of a converging lens 41 located so as to stand facing the Fourier transform lens array optical system 30, a first resonator mirror 42, and a second resonator mirror 50 located on the back surface side of the array laser 10 opposite to the laser beam radiating surface. The Fourier transform lens array optical system 30 is located such that its front Fourier transform plane SB may coincide with the Fourier transform plane SA of the Fourier transform lens 20.

The radius of curvature of the reflecting surface of the first resonator mirror 42 is set to be equal to the radius of curvature of the wave front of the laser beam, which has been converged by the converging lens 41, at the position of the first resonator mirror 42.

Also, the number N of the laser beam sources 11, 11, . . . constituting the array laser 10, the pitch d1 of the array laser 10, the focal length $f_1$ of the Fourier transform lens 20, the lens pitch p of the Fourier transform lens array optical system 30, the focal length $f_2$ of the Fourier transform lens array optical system 30, and the wavelength λ of the laser beam are set so as to satisfy the conditions of Formulas (1) and (2).

$$\frac{d_1 p}{\lambda f_1} = I \tag{1}$$

where $d_1/\lambda f_1$ corresponds to the variation Δα of the angular spectrum $\alpha_m$, and I represents an integer other than 0.

$$\frac{f_2}{f_1} d_1 N = p \tag{2}$$

How this embodiment of the laser apparatus in accordance with the present invention operates will be described hereinbelow. As an aid in facilitating the explanation, an analysis is made on the assumption that the array laser 10, the Fourier transform lens array optical system 30, and the like, are located in a one-dimensional form in the plane of the sheet of FIG. 1.

The laser beams Li, which have been radiated out of the laser beam sources 11, 11, . . . constituting the array laser 10, are caused by the Fourier transform lens 20 to intersect one another and are superposed one upon another such that they have a predetermined angle difference (λ·Δα) with respect to one another on the Fourier transform plane SA of the Fourier transform lens 20. Far field patterns of the array laser 10 are thus formed on the Fourier transform plane SA. The amplitude distribution $\psi_1(u)$ of the far field patterns of the array laser 10 at a distance u from the optical axis on the Fourier transform plane SA constitutes an interference pattern resulting from the superposition of the amplitude distributions of the radiated laser beams having a central angular spectrum $\alpha_m$ and is represented by Formula (3).

$$\Psi_1(u) = \sum_{m=1}^{N} A_m \exp(i\phi_m) \exp(-2\pi i \alpha_m u) \tag{3}$$

where $A_m$: the amplitude of each laser beam Li $\phi_m$: the phase of each laser beam Li $$\alpha_m = \frac{d_1}{\lambda f_1} \left( m - \frac{N+1}{2} \right)$$

the central angular spectrum of each laser beam

The interference pattern of the amplitude distribution $\psi_1(u)$ represented by Formula (3) is divided by the Fourier transform lens array optical system 30 into a plurality of small regions corresponding to the number of the lenses (the array number). Also, reproduced near field patterns of the array laser 10 are reproduced for the respective small regions on a back Fourier transform plane SC of the Fourier transform lens array optical system 30. The amplitude distribution $\psi_2(w)$ of the near field patterns of the array laser 10 at a distance w from the optical axis on the back Fourier transform plane SC (i.e. the optical axis of the entire Fourier transform lens array optical system 30, and not the optical axis of each of the Fourier transform lens optical systems constituting the Fourier transform lens array optical system 30) is represented by Formula (4).

$$\Psi_2(w) = c \sum_{i=-L}^{L} \sum_{m=1}^{N} A_m \exp\{i\phi_m - 2\pi i \alpha_m(1p+\delta)\} \cdot \text{sinc}\left\{ \frac{c}{\lambda f_2}(w + \lambda f_2 \alpha_m - 1p - \delta) \right\} \quad (4)$$

where

2L+1: the array number of the Fourier transform lens array optical system

δ: the amount of shift of the Fourier transform lens array optical system with respect to the array laser c=ηp: the equivalent aperture diameter of the aperture array η: the efficiency of the equivalent aperture diameter with respect to the lens diameter of the Fourier transform lens array optical system Formula (1) indicates that the array pitch p of the Fourier transform lens array optical system 30 coincides with integral multiples of the pitch of the interference fringes of the array laser 10 projected onto the Fourier transform plane SA of the Fourier transform lens 20. By the substitution of Formula (1) into Formula (4) and setting the amount of shift as δ=0, the amplitude distribution $\psi_2(w)$ of the array laser 10 can be modified into Formula (5).

$$\Psi_2(w) = c \sum_{i=-L}^{L} \sum_{m=1}^{N} A_m \exp\{i\phi_m\}\exp\{i\pi \cdot 1I(N+1)\} \cdot \text{sinc}\left\{ \frac{c}{\lambda f_2}(w + \lambda f_2 \alpha_m - 1p) \right\} \quad (5)$$

According to Formula (5), in cases where the number N of the laser beam sources of the array laser 10 is odd or in cases where I in Formula (1) is even, the oscillation phase and the intensity represented by the near field patterns of the array laser 10 reproduced on the back Fourier transform plane SC of the Fourier transform lens array optical system 30 are kept the same as the oscillation phase and the intensity occurring at the time of radiation from the array laser 10. In cases where the number N of the laser beam sources of the array laser 10 is even and I in Formula (1) is odd, the phase is inverted alternately with respect to the array pitch p of the Fourier transform lens array optical system 30. In cases where the phase is thus inverted, the phase difference of π occurring in accordance with the array pitch p of the Fourier transform lens array optical system 30 can be compensated for by locating a phase correcting plate in the vicinity of the front side or the back side of the aperture array 32. In this manner, the amplitude distribution of the array laser 10, in which the oscillation phase is kept unchanged, can be reproduced on the back Fourier transform plane SC of the Fourier transform lens array optical system 30. As the phase correcting plate, a glass plate may be provided with protrusions and recesses, which have a difference of a height h [=λ/{2(n−1)}], where λ represents the wavelength, and n represents the refractive index of the glass plate], in the optical axis direction and with the period two times as large as the lens array pitch. The protrusions and recesses may be located alternately for the adjacent laser beam passing parts of the aperture array 32, the phase difference of π may be compensated for by means of the difference of the optical path length.

The pitch $d_2$ of the patterns of the array laser 10 reproduced on the back Fourier transform plane SC of the Fourier transform lens array optical system 30 in the manner described above, the beam diameter D of the array laser 10, the fill factor (i.e. the ratio of the beam diameter D to the pitch $d_2$ of the patterns of the array laser 10) F are respectively represented by Formulas (6), (7), and (8).

$$d_2 = \lambda f_2 \Delta \alpha_m = \frac{f_2}{f_1} d_1 \quad (6)$$

$$D = \frac{1.64 \lambda f_2}{C} \quad (7)$$

$$F = \frac{D}{d_2} = \frac{1.64}{c \Delta \alpha_m} = \frac{1.64}{\eta I} \quad (8)$$

According to Formula (8), the fill factor F takes a maximum value when I=1. At this time, the fill factor F is in inverse proportion to the efficiency η. Therefore, the fill factor F can be rendered large by making the efficiency η small.

This embodiment of the laser apparatus is set such that it may satisfy Formula (2). Therefore, the distance between the near field patterns of the array laser 10 reproduced by the Fourier transform lens optical systems, which are adjacent to each other among the plurality of the Fourier transform lens optical systems constituting the Fourier transform lens array optical system 30, becomes equal to $d_2$. The near field patterns of the array laser 10 are projected at an equal pitch as a whole on the back Fourier transform plane SC of the Fourier transform lens array optical system 30.

How the near field patterns of the array laser 10 reproduced on the back Fourier transform plane SC of the Fourier transform lens array optical system 30 stand in a line at an equal pitch as a whole will be described in detail hereinbelow with reference to FIG. 13. As illustrated in FIG. 13, near field patterns 10A, 10A, . . . of the array laser 10 are reproduced by the plurality of the Fourier transform lens optical systems constituting the Fourier transform lens array optical system 38. Each of the near field patterns 10A, 10A, . . . has peaks 18Ai, 10Ai, . . . at predetermined intervals $d_2$. The positions, at which the peaks 10Ai, 10Ai, . . . are located, correspond to the pitch $d_1$ of the plurality of the laser beam sources 11, 11, . . . constituting the array laser 10. When the two near field patterns 10A, 10A of the array laser 10 reproduced by two adjacent Fourier transform lens optical systems are considered, in cases where Formula (2) is satisfied, the distance $d_A$ between the two peaks 10Ai, 10Ai of the two near field patterns 10A, 10A, which peaks are adjacent to each other, becomes equal to the pitch $d_2$ of the peaks 10Ai, 10Ai, . . . of the near field pattern 10A of the array laser 10 reproduced by a single Fourier transform lens optical system. In cases where all of the distances between adjacent peaks 10Ai, 10Ai of the near field patterns 10A, 10A, . . . of the array laser 10 reproduced on the back Fourier transform plane SC are equal, it is regarded that the near field patterns of the array laser 10 stand in a line at an equal pitch as a whole.

At this time, Formula (5) can be modified into Formula (9). It is presumed that, in cases where the number N of the laser beam sources of the array laser 10 is even and I in Formula (1) is odd, the phase distribution inverted alternately with respect to the array pitch p of the Fourier transform lens array optical system 30 is corrected by the phase correcting means, such as a phase correcting plate.

$$\Psi_2(w) = c \sum_{i=-L}^{L} \sum_{m=1}^{N} A_m \exp(i\phi_m) \mathrm{sinc} \left\{ \frac{c}{\lambda f_2} (w + pg) \right\} \quad (9)$$

where $$g = \frac{1}{N} \left( m - \frac{N+1}{2} \right) - 1$$

The amplitude distribution $\psi_3(f_w)$ of the array laser 10 at the fax field of the Fourier transform lens array optical system 30 can be obtained by carrying out Fourier transform of Formula (9) and is thus represented by Formula (10).

$$\Psi_3(fw) = \lambda f_2 \mathrm{rect} \left( \frac{\lambda f_2 f_w}{c} \right) \quad (10)$$

$$\sum_{i=-L}^{L} \sum_{m=1}^{N} A_m \exp(i\phi_m) \exp(2\pi i p g f_w)$$

where $$f_w = \frac{\tan\theta}{\lambda}$$

θ: angle of far field

A more concrete constitution will be described hereinbelow. First, parameters of respective components are set as follows:

Number N of the laser beam sources 11, 11, . . . constituting the array laser 10=9

Pitch $d_1$ between adjacent laser beam sources 11, 11 of the array laser 10=125 μm Wavelength λ of the laser beam=781.29 nm Focal length $f_1$ of the Fourier transform lens 20=8 mm

I=1, η=1

Array number M of the Fourier transform lens array optical system 30=21

These values are substituted into Formulas (1), (2), (6), (7), and (8), and the values of the other parameters are set as follows:

Array pitch p of the Fourier transform lens array optical system 30=50 μm

Focal length $f_2$ of the Fourier transform lens array optical system 30=355.6 μm Pitch $d_2$ of the array laser 10 reproduced on the back Fourier transform plane SC of the Fourier transform lens array optical system 30=5.6 μm Beam diameter D of the array laser 10 reproduced on the back Fourier transform plane SC of the Fourier transform lens array optical system 30=9.1 μm Fill factor F=1.64

Figure 2:
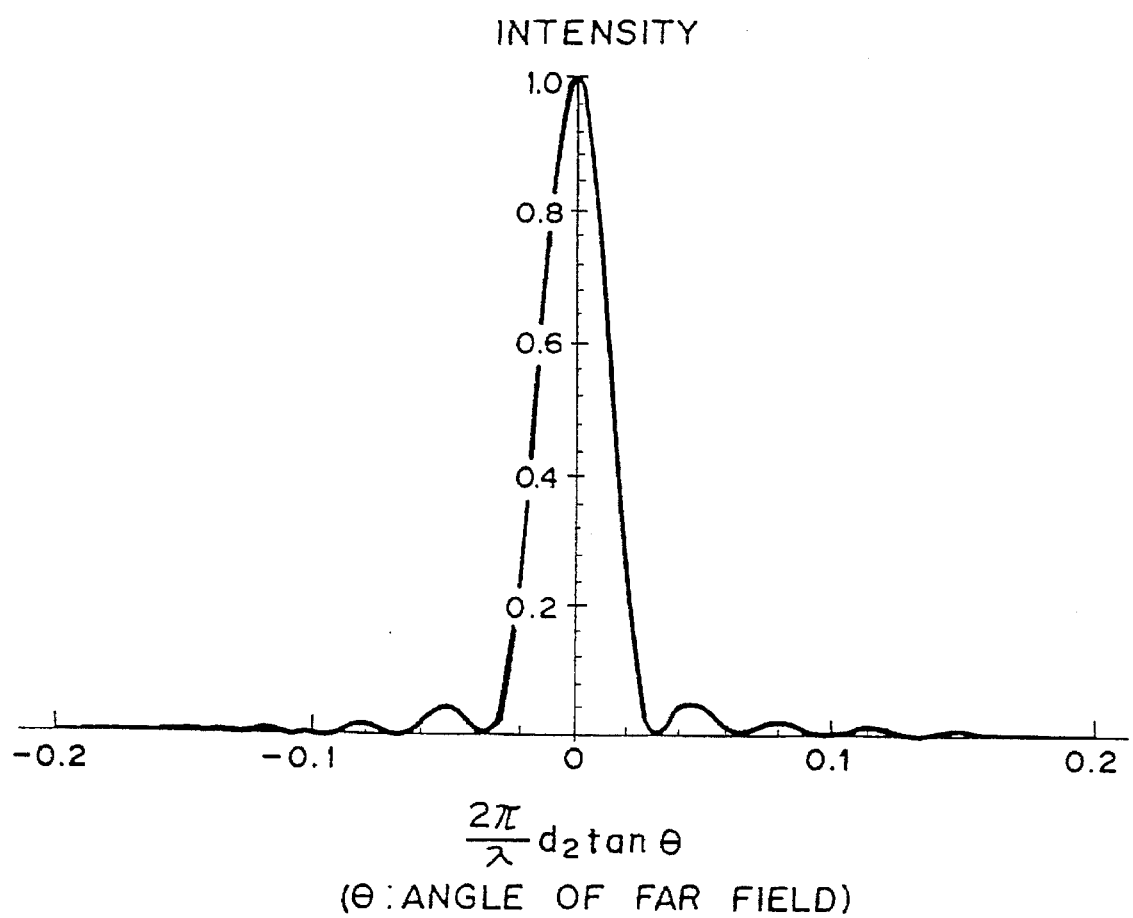
FIG. 2 is an intensity distribution diagram showing the intensity distribution of a combined laser beam radiated out of the first embodiment of FIG. 1 (wherein n=9)

FIG. 2 shows the results of the intensity distribution of the laser beam, which is radiated out of the laser apparatus wherein the parameters of the respective components are set at the values described above, with respect to the angle of far field θ.

From FIG. 2, it has been confirmed that this embodiment of the laser apparatus radiates out the laser beam having the intensity distribution, which is sufficiently single-lobed.

An analysis will be made hereinbelow with respect to the oscillation eigen mode of this embodiment of the laser apparatus.

The super modes, which can occur in the resonator structure of this laser apparatus, are determined by the set of the amplitude and the phase of each laser beam, which propagates self-consistently in the resonator structure. The super modes are expressed as the solution vectors of the eigen equation of Formula (11), and N number of modes are present.

$$[r_o \, r \exp(i 2 \sigma L) R_r - I] e = 0 \quad (11)$$

where $R_r$ represents the reflection matrix in the resonator structure, e represents the eigen vector, $r_o$ represents the amplitude reflectance of the back end face of the laser, r represents the amplitude reflectance of the radiating mirror, and σ represents the complex propagation constant of the super mode.

From Formula (11), the value of $(r_o \cdot r)^{-1} \exp(-i 2 \sigma L)$ is the eigen value λv of $R_r$, and the super mode of the resonator structure is the eigen vector of the matrix $R_r$. Therefore, the power threshold gain gv of the super mode of this resonator structure is given by Formula (12) from the eigen value λv.

$$(r_o r)^{-1} \exp(-i 2 \sigma L) = \lambda v \quad (12)$$

$$\sigma v = \frac{n \omega v}{c} - \frac{i g v}{2}$$

$$\therefore g v = \frac{1}{L} \ln \left( \frac{1}{r_o r} \right) + \frac{1}{L} \ln \left( \frac{1}{|\lambda v|} \right)$$

Also, the reflection matrix represents the coupling coefficient between the respective laser beams, which are radiated out of the laser beam sources 11, 11, . . . constituting the array laser 10, due to the effects of the round trip in the resonator. Specifically, due to the effects of the round trip in the resonator structure, each of the laser beams, which are respectively radiated out of the laser beam sources 11, 11, . . . constituting the array laser 10, is reflected to the opposite side with respect to the optical axis and coupled with the laser beam located at the position, to which the laser beam is reflected. Further, the laser beam, which has been reflected by the first resonator mirror 42, is not converged to the back Fourier transform plane SC and is diverged due to the diffraction effects. The laser beam, which has been reflected by the first resonator mirror 42, is thus coupled with the other laser beam, which is present in the vicinity.

Figure 3:
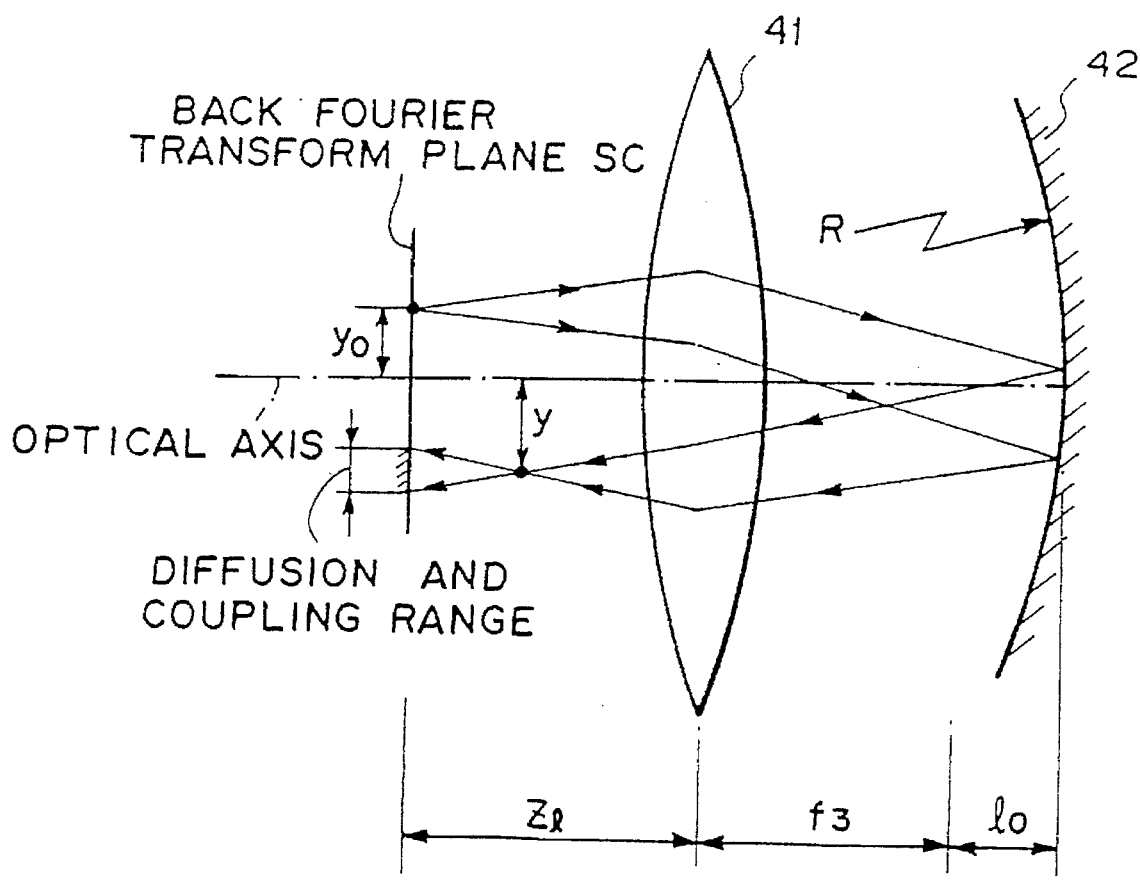
FIG. 3 is an explanatory diagram showing the optical paths of laser beams having been radiated out of two-dimensional array laser beam sources.

As an aid in facilitating the explanation, the near field patterns of the array laser 10, which are reproduced on the back Fourier transform plane SC of the Fourier transform lens array optical system 30, may be regarded as secondary array laser beam sources. In such cases, coupling between the laser beams, which are radiated out of the laser beam sources 11, 11, . . . constituting the array laser 10, is identical with the coupling between the laser beams, which come from the secondary array laser beam sources, due to reflection by the resonator mirror optical system 40. As illustrated in FIG. 3, in cases where the laser beam coming from the secondary array laser beam source on the back Fourier transform plane SC, which source is located at a distance $y_0$ from the optical axis, is reflected from the first resonator mirror 42 and condensed on the back Fourier transform plane SC, the distance y from the optical axis to the position, at which the laser beam is converged, can be calculated with Formula (13). (The position, at which the laser beam is converged, has been detected with paraxial ray tracing by assuming that the beam diameter of each laser beam is sufficiently small.)

$$y = -\frac{y_0}{f_3}\left[ f_3 + 2l_o^2 \left\{ \frac{1}{R} + \left(\frac{f_3}{Z_d}\right)^2 \left(\frac{1}{f_3} + \frac{1}{R}\right) \right\} \right] \quad (13)$$

where $$Z_d = \frac{4\lambda f_3^2}{\pi B^2}$$

B: the diameter of the laser beam radiated out of the Fourier transform lens array optical system 30 ($\approx$P·M)

$f_3$: the focal length of the converging lens 41

$l_0$: the distance from the focal point of the converging lens 41 to the first resonator mirror 42

R: the radius of curvature of the first resonator mirror 42

Arranging Formula (13) yields $y=-y_0$. This indicates that the laser beam is reflected to the position symmetric with respect to the optical axis and is coupled with the other laser beam. Therefore, in cases where the array laser 10 and the Fourier transform lens array optical system 30 are located in a one-dimensional pattern and Formula (1) is satisfied, by the synergistic effects of the coupling and the beam divergence due to the diffraction, the respective elements $\{r_{ij}\}$ of the reflection matrix $R_r$ representing the coupling coefficient can be represented by Formula (14).

$$r_{ij} = -\frac{\eta}{(2L+1)} \cdot \exp(2ikD) Rect\left[\frac{1}{\eta N}\left(i - \frac{N+1}{2}\right)\right] \cdot \quad (14)$$

$$\sum_{i1=-L}^{L} \sum_{i2=-L}^{L} \exp\left[-2\pi i \frac{pd_i}{\lambda f_1}\left(i - \frac{N+1}{2}\right)l_2\right] \cdot$$

$$\int_{-\infty}^{\infty} Rect(x) \exp\left(-\pi i \eta^2 \lambda z \left(\frac{p}{\lambda f_2}\right)^2 x^2\right) \cdot$$

$$\exp[-2\pi i \eta l\{(i+j-1) - N(l1+l2+1)\}x] dx$$

where

D: the resonator length z: the distance between the position of the secondary array laser beam source, which is formed on the back Fourier transform plane SC of the Fourier transform lens array optical system 30, and the position, at which the laser beam from the secondary array laser beam source is reflected and caused to form an image by the resonator mirror optical system 40

In cases where the distance z between the position of the secondary array laser beam source, which is formed on the back Fourier transform plane SC of the Fourier transform lens array optical system 30 and the position, at which the laser beam from the secondary array laser beam source is reflected and caused to form an image by the resonator mirror optical system 40, is set to be large, the laser beams Li radiated out of the array laser 10 can be coupled with one another in parallel and uniformly.

Figure 4:
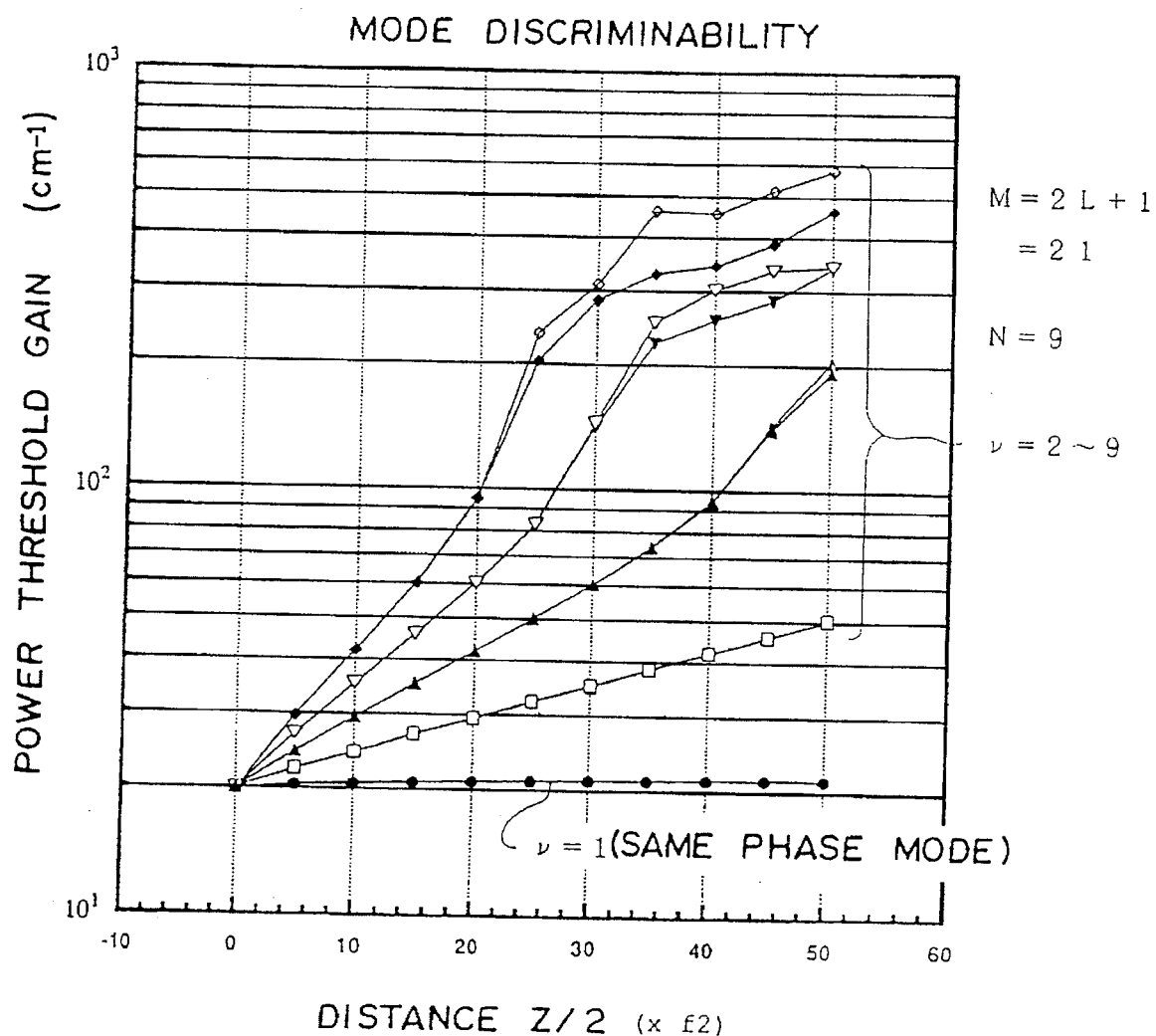
FIG. 4 is a graph showing the results of calculations of power threshold gain values (wherein N=9)

FIG. 4 shows the results of calculations of power threshold gain values with the eigen equation of Formula (11) (wherein N=9). From FIG. 4, it has been confirmed that the power threshold gain values of the eigen mode ($\nu$=1), in which the respective laser beams Li are radiated with the same phase out of the array laser 10, are smallest, the differences between the power threshold gain values of the eigen mode ($\nu$=1) and the power threshold gain values of the other eigen modes ($\nu$=2 to 9) become sufficiently large as the distance z becomes large, and therefore the discrimination of the eigen mode, in which the respective laser beams Li are radiated with the same phase out of the array laser 10, can be kept good.

As described above, with this embodiment of the laser apparatus, the laser beams produced by the array laser can be coherently combined with one another and radiated out by the Fourier transform lens array optical system 30 and the resonator mirror optical system 40. Also, in cases where the parameters of the respective components are set so as to satisfy Formulas (1) and (2), and the distance z between the position of the secondary array laser beam source, which is formed on the back Fourier transform plane SC of the Fourier transform lens array optical system 30, and the position, at which the laser beam from the secondary array laser beam source is reflected and caused to form an image by the resonator mirror optical system 40, is set to be large, the respective laser beams can be uniformly coupled with one another. Further, in cases where I in Formula (1) is set to be 1, a combined laser beam, which has an intensity distribution with good single-lobed characteristics as illustrated in FIG. 2, can be radiated out of the first resonator mirror 42, and a laser beam having a high output power can be obtained easily.

The laser apparatus in accordance with the present invention is not limited to the first embodiment described above. For example, as in a second embodiment shown in FIG. 5, in lieu of the array laser 10 and the Fourier transform lens 20, a plurality of collimating optical systems, each of which comprises a laser device 12 and a collimator lens 21 or 22, may be located such that the respective laser beams may intersect with one another with a predetermined angle difference ($\lambda$·$\Delta\alpha$) from one another on a predetermined plane.

Figure 5:
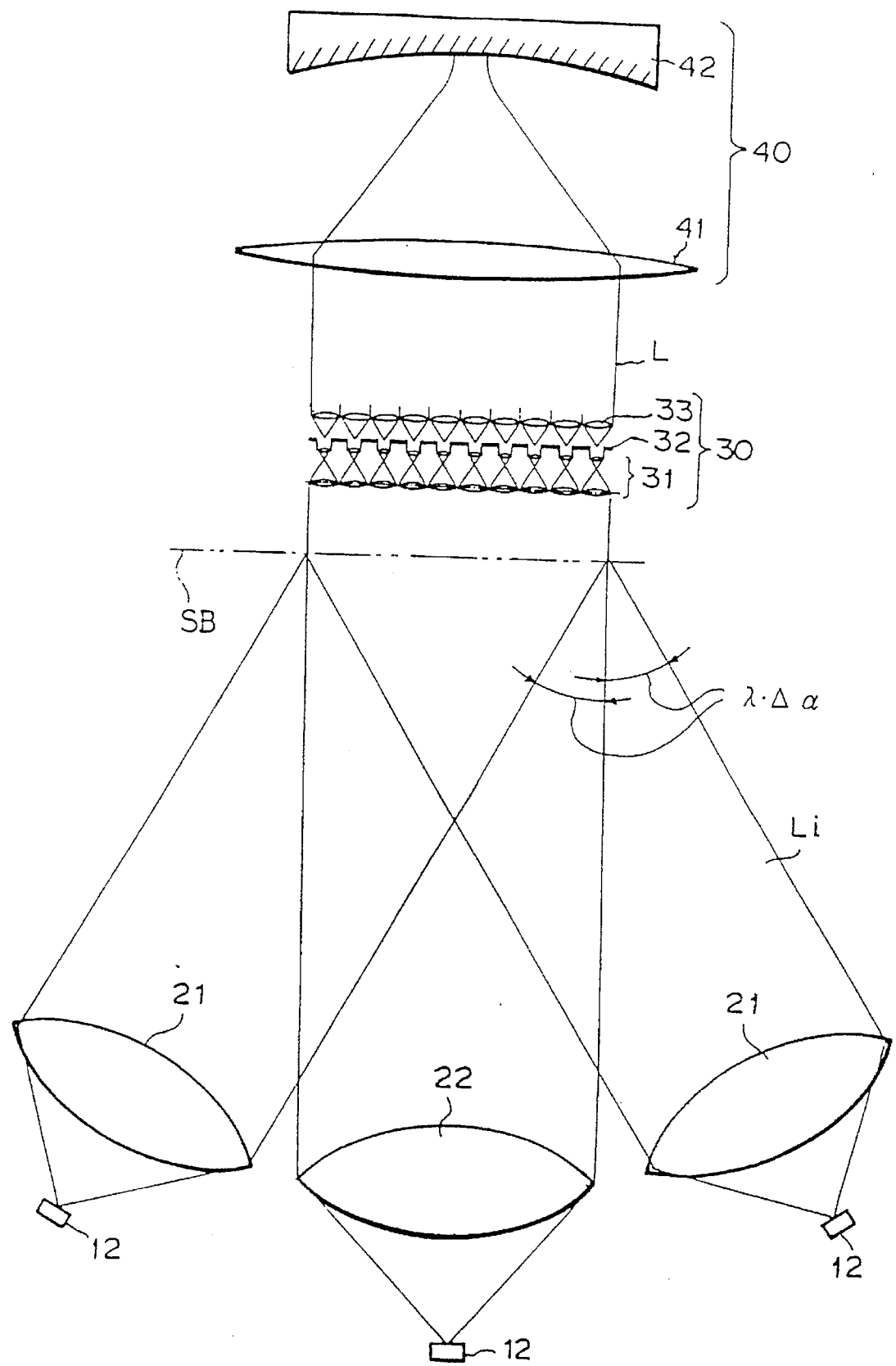
FIG. 5 is a schematic view showing a second embodiment of the laser apparatus in accordanae with the present invention.

In the second embodiment shown in FIG. 5, the variation $\Delta\alpha$ ($=\alpha_{m+1}-\alpha_m$) of the angular spectrum $\alpha_m$ of each laser beam, the array pitch p of the Fourier transform lens array optical system 30, the number N of the collimating optical systems, each of which comprises the laser device 12 and the collimator lens 21 or 22, the focal length $f_2$ of the Fourier transform lens array optical system 38, and the wavelength $\lambda$ of the laser beam may be set so as to satisfy the conditions of Formulas (15) and (16). Formula (15) is obtained by modifying $f_1$ in Formula (1) by using the variation $\Delta\alpha$ of the angular spectrum (i.e. the angular spectrum difference). Formula (16) is obtained by modifying $f_1$ in Formula (2) by using the variation $\Delta\alpha$ of the angular spectrum (i.e. the angular spectrum difference).

$$p \cdot \Delta\alpha = I \quad (15)$$

where I represents an integer other than 0.

$$\lambda \cdot \Delta\alpha \cdot f_2 \cdot N = p \quad (16)$$

Figure 6:
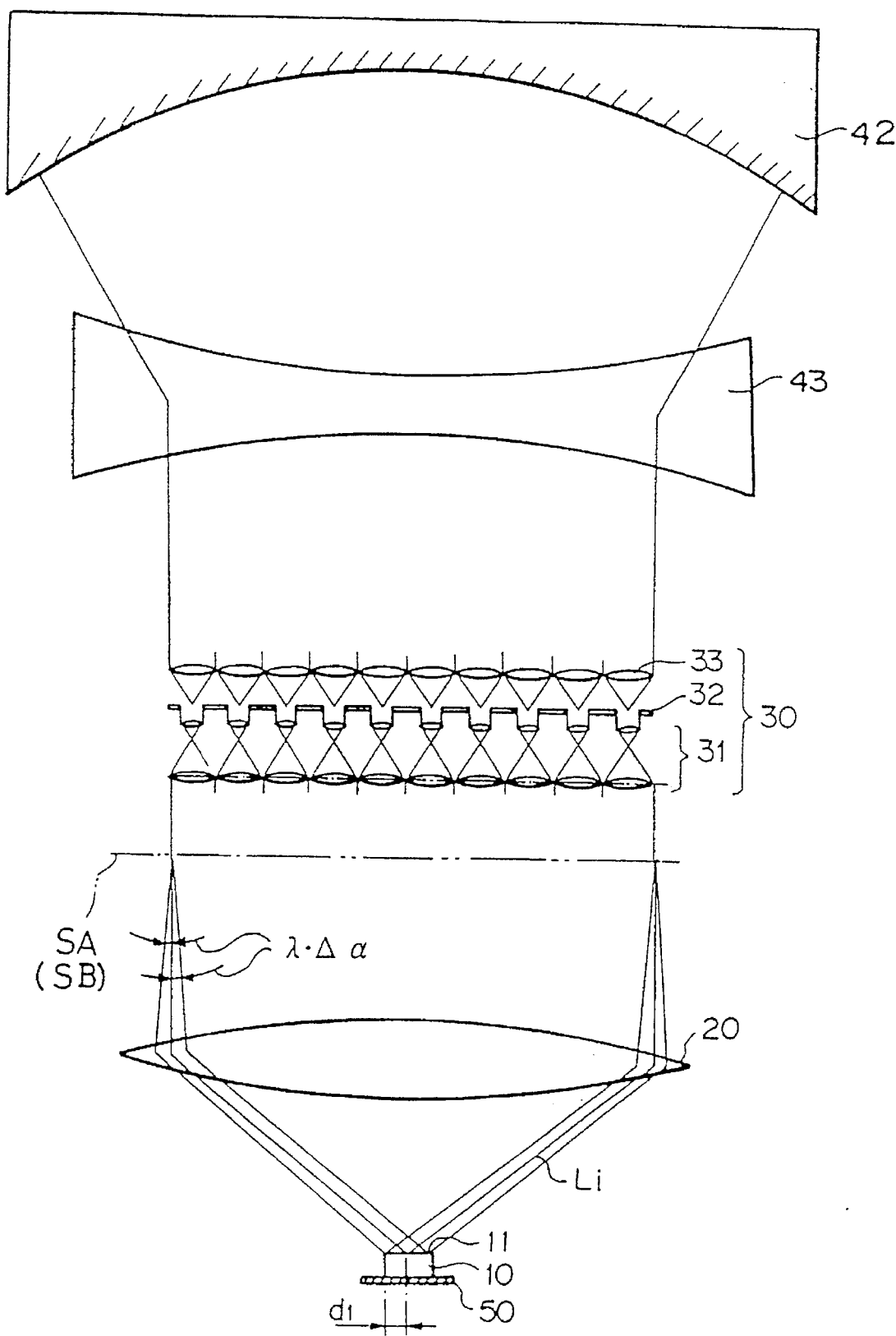
FIG. 6 is a schematic view showing a third embodiment of the laser apparatus in accordance with the present invention.
Figure 7:
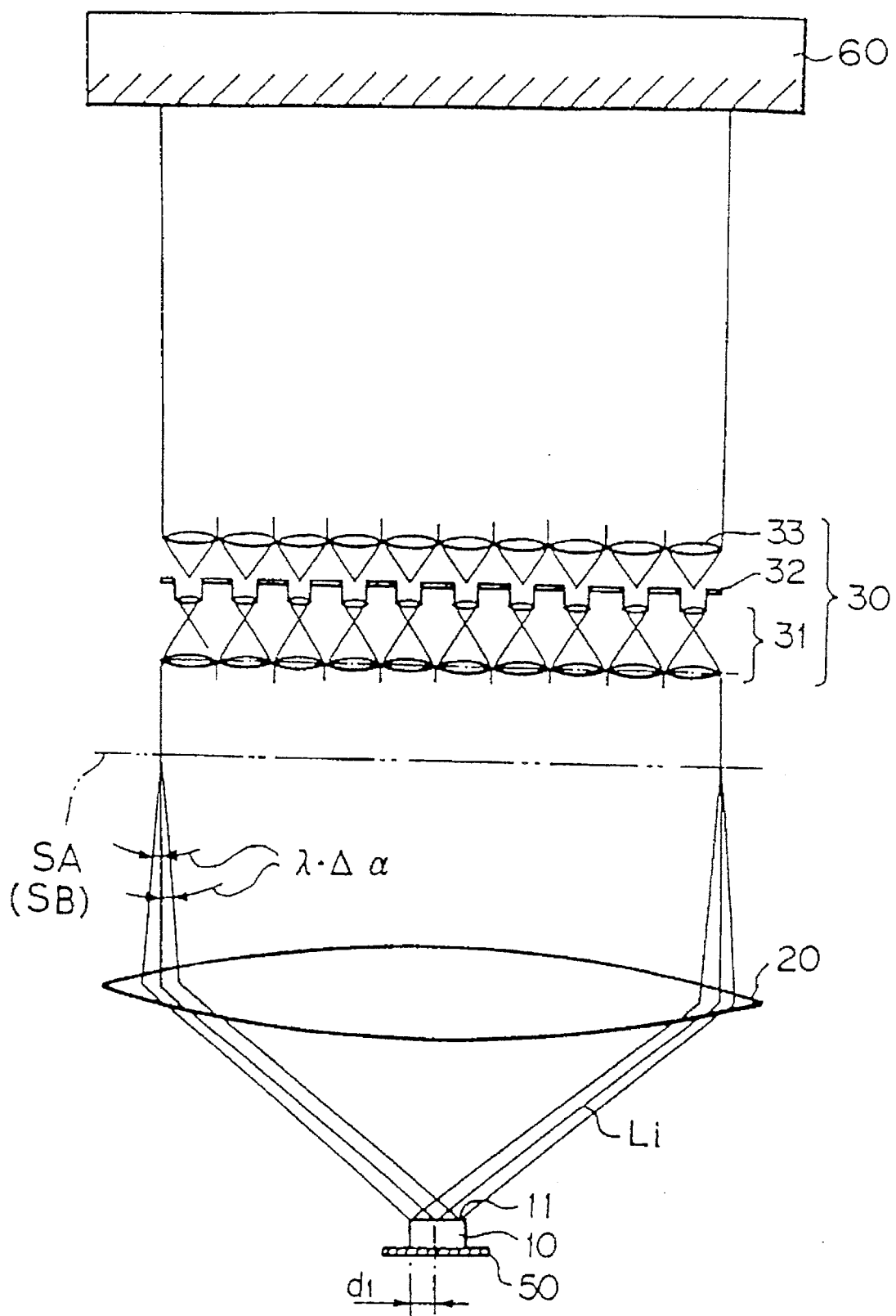
FIG. 7 is a schematic view showing a fourth embodiment of the laser apparatus in accordance with the present invention.

Also, as in a third embodiment shown in FIG. 6, in lieu of the converging lens 41 used in the resonator mirror optical system 40, a diverging lens 43 may be employed. Further, the beam radiated out of the Fourier transform lens array optical system 30 is an approximately plane wave. Therefore, as in a fourth embodiment shown in FIG. 7, instead of the converging lens arnd the diverging lens being used, a plane mirror 60 may be employed as the resonator mirror.

The Fourier transform lens array optical system 30 need not necessarily be located on the same plane. For example, the Fourier transform lens array optical system 30 may be located on a spherical plane having its center at the array laser 10.

In the embodiments described above, the Fourier transform lens array optical system 30 is composed of the beam expander array 31, the aperture array 32, and the Fourier transform lens array 33. However, in the laser apparatus in accordance with the present invention, the Fourier transform lens array optical system 30 need not necessarily be provided with the beam expander array 31 and the aperture array 32 and may be constituted of only the Fourier transform lens array 33. In the laser apparatus wherein no aperture array is provided, the value of η in Formula (4) may be set to be 1.

Figure 8:
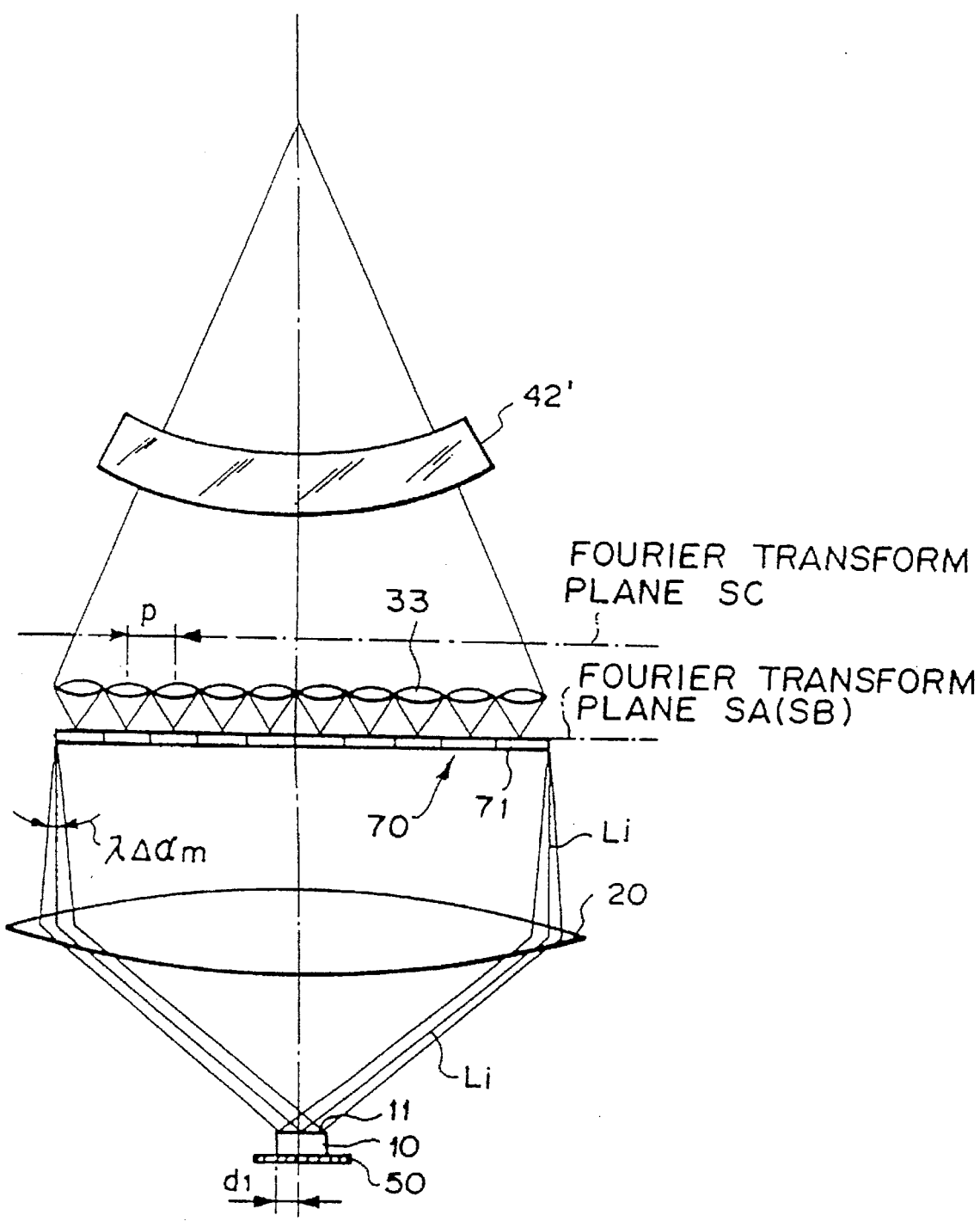
FIG. 8 is a schematic view showing a fifth embodiment of the laser apparatus in accordance with the present invention.

FIG. 8 shows a fifth embodiment of the laser apparatus in accordance with the present invention. The fifth embodiment is applied basically when the value of the left side of Formula (1) does not become equal to an integer I, and Formula (17) is satisfied in the laser apparatus shown in FIG. 1. Specifically, in the fifth embodiment, the value of the product of the array pitch p of the Fourier transform lens array 33 and the variation $\Delta\alpha$ of the angular spectrum of each of the laser beams Li is set to be equal to a value, which falls within the range of larger than 0 to smaller than 2 and which is other than 1.

$$\frac{d_1 p}{\lambda f_1} = I + \Delta \tag{17}$$

where

I: an integer other than 0

$\Delta$: the amount of deviation from integers

0<|$\Delta$|<1

0<I+$\Delta$<2

The fifth embodiment of the laser apparatus comprises an array laser 10 composed of N number of laser beam sources 11, 11, ..., which produce coherent laser beams Li having a wavelength $\lambda$ and which are located along a straight line at a pitch $d_1$. The laser apparatus also comprises a Fourier transform lens 20, which has a focal length $f_1$ and is located so as to stand facing the array laser 10. The laser apparatus further comprises a Fourier transform lens array 33 for dividing far field patterns of the array laser 18, which are projected onto the Fourier transform plane SA of the Fourier transform lens 20, into small regions. The laser apparatus still further comprises a resonator mirror optical system 40, which is constituted of a first resonator mirror 42' and a second resonator mirror 50. The first resonator mirror 42' is located so as to stand facing the Fourier transform lens array 33. The first resonator mirror 42' perpendicularly reflects the laser beams having been radiated out of the Fourier transform lens array 33 or transmits a laser beam having a radiant energy not lower than a predetermined amount. The second resonator mirror 50 is located on the back surface side of the array laser 10 opposite to the laser beam radiating surface. As in the first embodiment, the Fourier transform lens array 33 is located such that its front Fourier transform plane SB may coincide with the Fourier transform plane SA of the Fourier transform lens 20. Also, a phase correcting plate 70 is located on the Fourier transform plane SA. The phase correcting plate 70 corrects the phase for each of the small split regions of the far field patterns of the array laser 10.

The phase correcting plate 70 is an array of phase correcting elements 71, 71, ..., which correct the phases of the laser beams passing through the plurality of the Fourier transform lenses constituting the Fourier transform lens array 33, such that the wave fronts of the laser beams after having passed through the plurality of the Fourier transform lenses constituting the Fourier transform lens array 33 may be smoothly connected with one another as a whole. The intensity distribution pattern of the combined laser beam, which occurs from optical coupling of the plurality of the laser beams, is thus rendered approximately perfectly single-lobed.

Figure 9A:
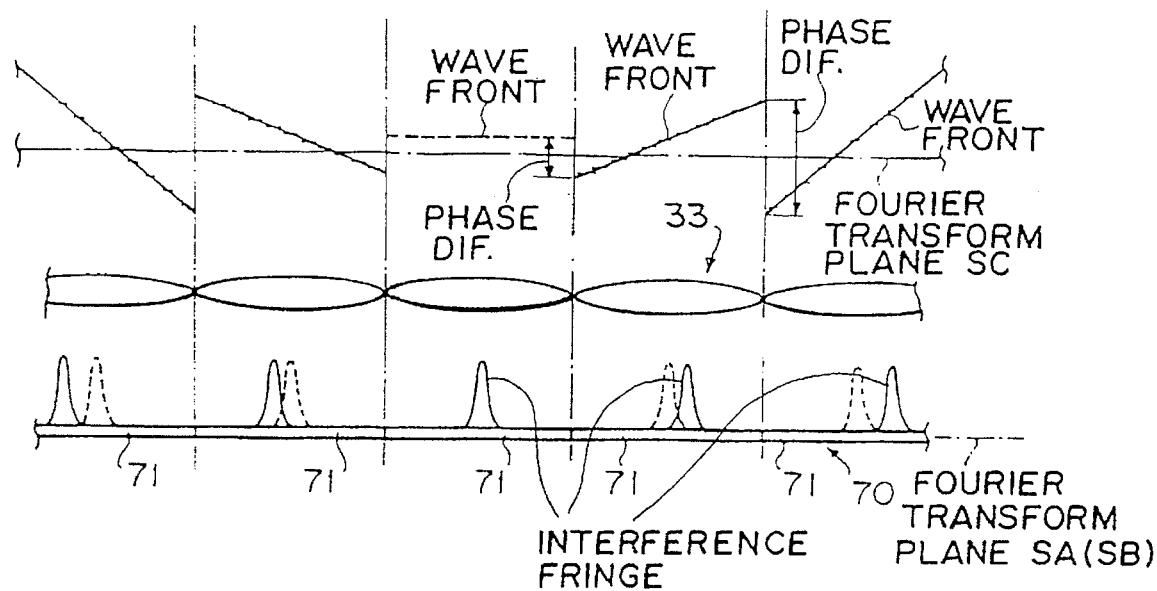
FIG. 9A is an explanatory view showing the state of wave fronts of laser beams, which have not been subjected to phase correction and have passed through a Fourier transform lens array 33.
Figure 9B:
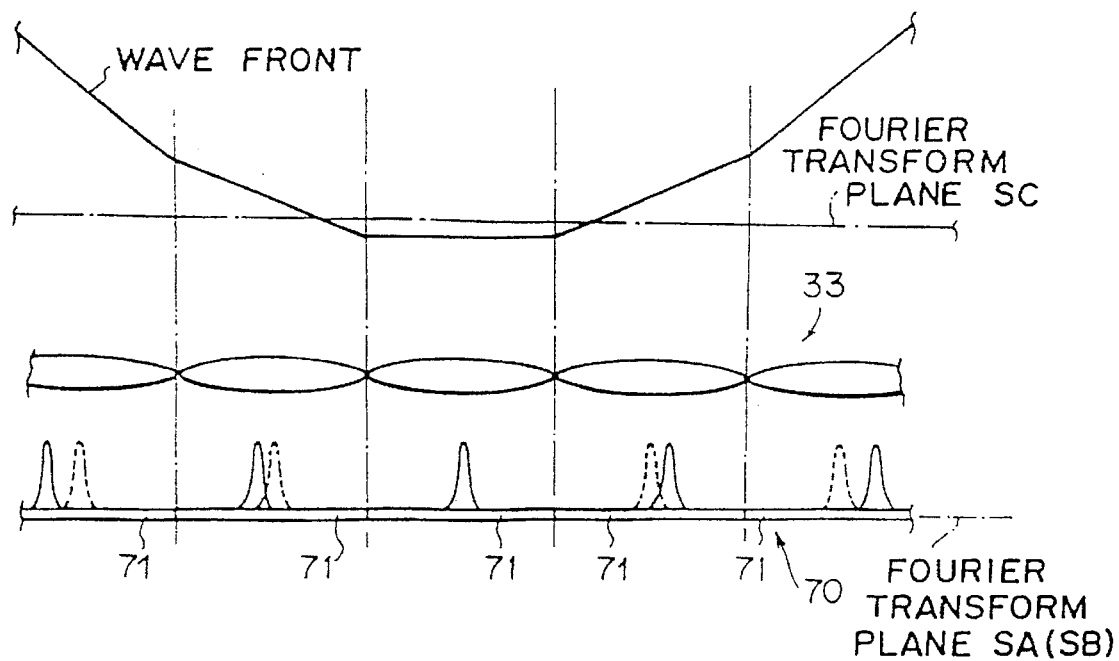
FIG. 9B is an explanatory view showing the state of wave fronts of laser beams, which have been subjected to phase correction and have passed through the Fourier transform lens array 33.

FIG. 9A is an explanatory view showing the state of the wave fronts of the laser beams, which have not been subjected to the phase correction with the phase correcting plate 70 and have passed through the Fourier transform lens array 33. FIG. 9B is an explanatory view showing the state of the wave fronts of the laser beams, which have been subjected to the phase correction and have passed through the Fourier transform lens array 33.

Such that the near field patterns of the array laser 10 may be formed at an equal pitch on the back Fourier transform plane SC of the Fourier transform lens array 33, the focal length $f_2$ of the Fourier transform lens array 33 is set so as to satisfy Formula (18).

$$f_2 = \frac{f_1 p}{d_1 N} = \frac{f_1}{d_1 N} \cdot \frac{\lambda f_1}{d_1} \times (I+\Delta) \tag{18}$$
$$= \frac{\lambda}{N} \left(\frac{f_1}{d_1}\right)^2 (I+\Delta)$$

Also, the radius of curvature of the reflecting surface of the first resonator mirror 42' is set to be equal to the radius of curvature of the wave front of the laser beam, which has passed through the Fourier transform lens array 33, at the position of the first resonator mirror 42'.

In the manner described below, the phase modulating pattern is set such that the phase correcting plate 70 may correct the phases of the laser beams passing through the plurality of the Fourier transform lenses constituting the Fourier transform lens array 33, and such that the intensity distribution pattern of the combined laser beam, which occurs from optical coupling of the plurality of the laser beams, may be rendered approximately perfectly single-lobed.

The laser beams Li, which have been radiated out of the laser beam sources 11, 11, ... constituting the array laser 10, are caused by the Fourier transform lens 20 to intersect one another and are superposed one upon another such that they have a predetermined angle difference ($\lambda$·$\Delta\alpha$) with respect to one another on the Fourier transform plane SA of the Fourier transform lens 20 (or on the front Fourier transform plane SB of the Fourier transform lens array 33). The far field patterns of the array laser 10 are thus formed in a predetermined direction u on the Fourier transform plane SA. The amplitude distribution $\psi_1(u)$ of the far field patterns of the array laser 10 constitutes an interference pattern resulting from the superposition of the amplitude distributions of the radiated laser beams having a central angular spectrum $\alpha_m$.

The interference pattern of the amplitude distribution $\psi_1(u)$ is divided by the Fourier transform lens array 33 into a plurality of small regions corresponding to the number of the lenses (the array number). Also, the near field patterns of the array laser 10 are reproduced for the respective small regions in a predetermined direction w on the back Fourier transform plane SC of the Fourier transform lens array 33. At this time, the amplitude $\psi_2(w)$ of the near field patterns of the array laser 10 on the back Fourier transform plane SC of the Fourier transform lens array 33 is represented by Formula (19).

$$\Psi_2(w) = c \sum_{i=-L}^{L} \sum_{m=1}^{N} A_m \exp(i\phi_m)\exp\{i\pi l1(N+1)\} \cdot \quad (19)$$

$$\exp\left[-2\pi i \Delta 1 \left\{ m - \left(\frac{N+1}{2}\right) \right\}\right] \cdot$$

$$\exp\left[-2\pi i \frac{\delta}{p}(l+\Delta) \left\{ m - \left(\frac{N+1}{2}\right) \right\}\right] \cdot$$

$$\mathrm{sinc}\left\{ \frac{c}{\lambda f_2}(w + \lambda f_2 \alpha_m - 1p - \delta) \right\}$$

FIG. 9A shows the state of the wave fronts obtained with the amplitude $\psi_2(w)$ of the array laser 10 on the back Fourier transform plane SC of the Fourier transform lens array 33, which amplitude is represented by Formula (19). As illustrated in FIG. 9A, the pitch of the interference fringes (indicated by the solid lines) of the array laser 10 projected on the Fourier transform plane SA of the Fourier transform lens 20 is shifted in position with respect to the array pitch p of the Fourier transform lens array 33. Therefore, the wave front of the laser beam after having passed through the Fourier transform lens array 33 involves the phase difference for each of the lenses constituting the Fourier transform lens array 33. In cases where $\delta=0$, Formula (19) can be modified into Formula (20).

$$\Psi_2(w) = C \sum_{i=-L}^{L} \sum_{m=1}^{N} A_m \exp(i\phi_m)\exp\{i\pi l1(N+1)\} \cdot \quad (20)$$

$$\exp\left[-2\pi i \Delta 1 \left\{ m - \left(\frac{N+1}{2}\right) \right\}\right] \cdot$$

$$\mathrm{sinc}\left\{ \frac{c}{\lambda f_2}(w + \lambda f_2 \alpha_m - 1p) \right\}$$

This embodiment of the laser apparatus is set so as to satisfy Formula (2), and therefore Formula can be modified into Formula (21).

$$\Psi_2(w) = c \sum_{i=-L}^{L} \sum_{m=1}^{N} A_m \exp(i\phi_m)\exp\left[-2\pi i \Delta 1 \left\{ m - \quad (21) \right.\right.$$

$$\left.\left.\left(\frac{N+1}{2}\right) \right\}\right] \cdot \mathrm{sinc}\left\{ \frac{c}{\lambda f_2}(w + pg) \right\}$$

As represented by the exponential function at the second term of Formula (21), the laser beams radiated out of the Fourier transform lens array 33 have the phase distribution, which is determined by the lens array position and the array laser portion. The phase difference at the boundary position between adjacent lenses in the Fourier transform lens array 33 is represented by Formula (22).

$$\Delta\phi_i = 2\pi\Delta \left\{ \left(\frac{N+1}{2}\right) + N1 \right\} \quad (22)$$

Therefore, with the operation for giving phase modulation (correction) represented by the formula shown below at each lens position in the Fourier transform lens array 33, the laser beams radiated out of the Fourier transform lens array 33 can form the wave fronts, which are smoothly connected with one another as a whole as illustrated in FIG. 9B. Also, as in the cases where the array pitch conditions of Formula (1) are satisfied, a laser beam having good single-lobed characteristics can be formed at the far field. Further, a laser beam converged at a predetermined position on the optical axis can be obtained without a converging lens being used.

$$\phi_c = 2\pi\Delta 1 \left\{ \left(\frac{N+1}{2}\right)1 + N\left(\sum_{i=1}^{i} i\right) \right\} \quad (23)$$

In the first to fifth embodiments described above, for the purposes of simplifying the analytic formula and facilitating the effects of the laser apparatus, the Fourier transform lens array optical system 30 (or the Fourier transform lens array 33) is located such that its front Fourier transform plane SB may coincide with the Fourier transform plane SA of the Fourier transform lens 20. However, the front Fourier transform plane SB need not necessarily coincide with the Fourier transform plane SA of the Fourier transform lens 20. In cases where the two Fourier transform planes SA and SB are shifted in the optical axis direction, the laser beams of the small regions after having passed through the Fourier transform lens array optical system 30 have the value of phase difference corresponding to the amount of the shift. Therefore, a laser beam having good single-lobed characteristics can be radiated by eliminating the phase difference with the correction of the positions of the laser beam sources 11, 11, ..., which constitute the array laser 10, in the optical axis direction, optimal design of the Fourier transform lens array optical system 30, or a phase correcting means, such as a phase correcting plate.

Also, in the embodiments described above, as an aid in facilitating the explanation, the array laser 10 is composed of the laser beam sources 11, 11, ... located in a one-dimensional direction. However, the laser apparatus in accordance with the present invention is also applicable when the array layer is composed of the laser beam sources 11, 11, ... located in a two-dimensional plane, which is normal to the optical axis. A laser apparatus, wherein the array laser composed of the laser beam sources 11, 11, ... located in a two-dimensional plane, will be described hereinbelow.

Figure 10A:
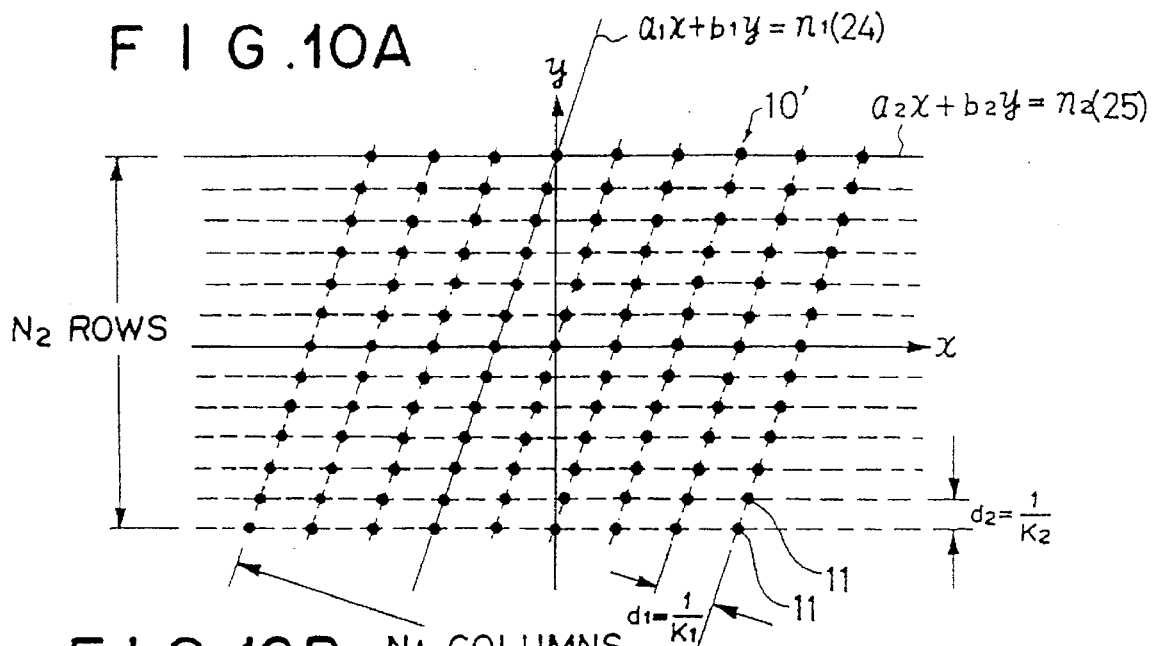
FIG. 10A is an explanatory view showing how a plurality of laser beam sources 11, 11, . . . constituting an array laser 10' are located in a two-dimensional plane (i.e. on an x-y coordinate system)

FIG. 10A is an explanatory view showing how a plurality of laser beam sources 11, 11, ... constituting an array laser 10' are located in a two-dimensional plane (i.e. on an x-y coordinate system). In the array laser 10', the laser beam sources 11, 11, ... are located in a skew periodic pattern. One of the skew lattice axes is taken as the x axis, and the laser beam source 11, which is present in the vicinity of the center of the array laser 10', is located at the origin. In such cases, it is assumed that the point of intersection of the skew lattice axes, i.e. each of the positions of the respective laser beam sources 11, 11, ..., is set so as to satisfy the simultaneous equations of Formulas (24) and (25).

$$a_1 x + b_1 y = n_1 \quad n_1 \text{:an integer} \quad (24)$$

$$a_2 x + b_2 y = n_2 \quad n_2 \text{:an integer} \quad (25)$$

where $$a_1 = \frac{\alpha}{d_1 \sqrt{1+\alpha^2}}, \quad b_1 = \frac{-1}{d_1 \sqrt{1+\alpha^2}}$$

$d_1$: the orthogonal distance between the skew lattice axes represented by Formula (24)

$\alpha$: the inclination of Formula (24) with respect to the x axis $a_2 = 0$, $b_2 = 1/d_2$ $d_2$: the orthogonal distance between the skew lattice axes represented by Formula (25)

Figure 11:
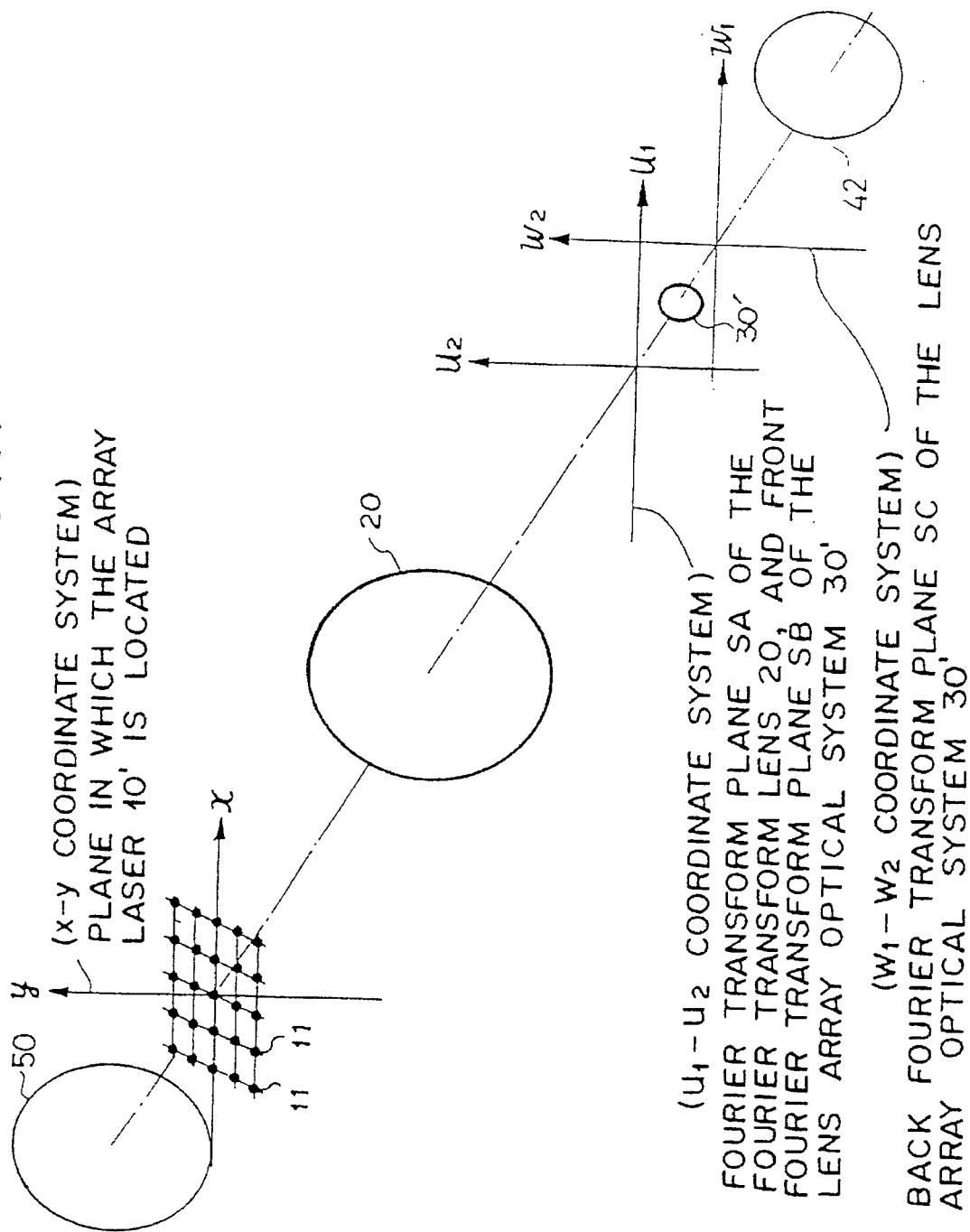
FIG. 11 is a schematic view showing an embodiment of the laser apparatus in accordance with the present invention, wherein an array laser 10' composed of laser beam sources located in a skew periodic pattern is used.

FIG. 11 shows the laser apparatus, in which the array laser 10 in the laser apparatus of FIG. 1 is replaced by the array laser 10'. With reference to FIG. 11, the laser beams having been radiated out of the array laser 10' are caused by the Fourier transform lens 20 to intersect one another and are superposed one upon another such that they have a predetermined angle difference with respect to one another on the Fourier transform plane SA of the Fourier transform lens 20 (on the $u_1$–$u_2$ coordinate system). In this manner, an interference pattern occurs. Far field patterns of the array laser 10' are thus formed on the Fourier transform plane SA. The amplitude distribution $\psi_1(u_1, u_2)$ of the far field patterns of the array laser 10' is represented by Formula (26).

$$\Psi_1(u_1, u_2) = \sum_{n1=-N1a}^{N1b} \sum_{n2=-N2a}^{N2b} A_{n1,n2} \exp(i\phi_{n1,n2}) \cdot \quad (26)$$

$$\exp\left[-2\pi i \left\{ \frac{d_1}{\lambda f_1} \left(\frac{\sqrt{1+\alpha^2}}{\alpha} u_1\right) n_1 - \frac{d_2}{\lambda f_1} \left(\frac{u_1}{\alpha} + u_2\right) n_2 \right\}\right]$$

where $A_{n1, n2}$: the amplitude of each laser beam $L_{n1, n2}$ $\phi_{n1, n2}$: the phase of each laser beam $L_{n1, n2}$ $N_1 = N_{1b} + N_{1a} + 1$: the laser array number in the x axis direction $N_2 = N_{2b} + N_{2a} + 1$: the laser array number in the y axle direction $f_1$: the focal length of the Fourier transform lens 20

According to Formula (26), the amplitude distribution $\psi_1(u_1, u_2)$ becomes the periodic distribution having peaks on the reciprocal lattice with respect to the skew lattice, which is the pattern of the array laser 10'. The position representing each peak is given by the solutions of the simultaneous equations of Formulas (27) and (28).

$$-\frac{b_1}{\Delta} \frac{u_1}{\lambda f_1} + \frac{a_1}{\Delta} \frac{u_3}{\lambda f_1} = J_1 \quad J_1 = \text{an integer} \quad (27)$$

$$\frac{b_2}{\Delta} \frac{u_1}{\lambda f_1} + \frac{a_2}{\Delta} \frac{u_2}{\lambda f_1} = J_2 \quad J_2 = \text{an integer} \quad (28)$$

$$\Delta = a_1 b_2 - a_2 b_1$$

Figure 10B:
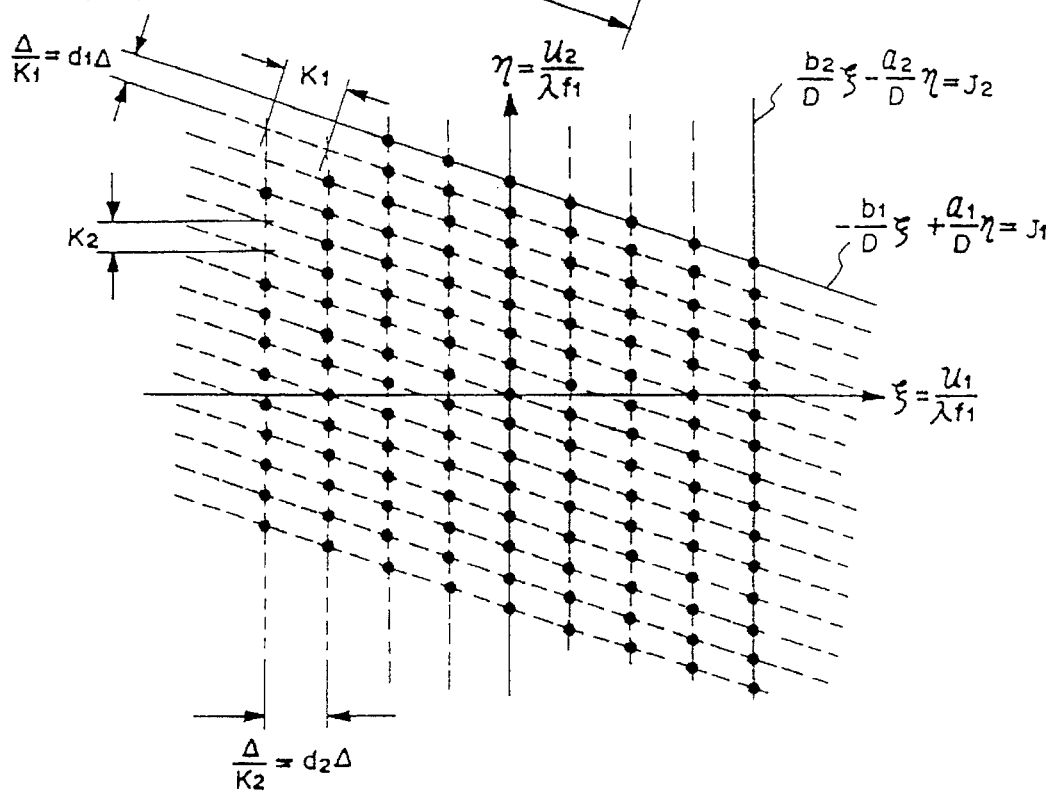
FIG. 10B is an explanatory view showing the positions of peaks of an amplitude distribution $\psi_1(u_1, u_2)$ of near field patterns of the array laser 10' on a Fourier transform plane (i.e. on a $u_1$-$u_2$ coordinate system)

The positions of the peaks on the Fourier transform plane SA (the $u_1$–$u_2$ coordinate system) are shown in FIG. 10B. The orthogonal distance between the reciprocal lattice axes is represented by Formulas (29) and (30).

$$D_1 = \frac{|\Delta|}{k_1} = d_1 |\Delta|$$

the orthogonal distance between the reciprocal lattice axes represented by Formula (27) (29)

$$D_2 = \frac{|\Delta|}{k_2} = d_2 |\Delta| \quad (55)$$

the orthogonal distance between the reciprocal lattice axes represented by Formula (28) (30)

where $$k_1 = \sqrt{a_1^2 + b_1^2} = \frac{1}{d_1}$$

$$k_2 = \sqrt{a_2^2 + b_2^2} = \frac{1}{d_2}$$

Therefore, a Fourier transform lens array optical system 30' (or a Fourier transform lens array 33') having a periodic structure similar to the reciprocal lattice may be located such that the front Fourier transform plane SB may coincide with the $u_1$–$u_2$ coordinate plane SA. In such cases, the far field patterns of the array laser 10' having a periodic distribution with the peaks on the reciprocal lattice are divided into a plurality of small regions. Also, near field patterns of the array laser 10' are reproduced for the respective small regions on the back Fourier transform plane SC (the $w_1$–$w_2$ coordinate system) of the Fourier transform lens array optical system 30'. (In FIG. 11, the Fourier transform lens array optical system 30' is shown in the simplified form.) Therefore, as in the embodiments described above, the near field patterns of the array laser 10' serve as the secondary array laser beam sources. The amplitude distribution $\psi_2(w_1, w_2)$ of the near field patterns of the array laser 10' on the back Fourier transform plane SC of the Fourier transform lens array optical system 30' is represented by Formula (31).

$$\Psi_2(w_1, w_2) = \frac{\sqrt{1+\alpha^2}}{|\alpha|} P_1 P_2 \sum_{i1=-L1}^{L1} \sum_{i2=-L2}^{L2} \sum_{n1=-N1a}^{N1b} \sum_{n2=-N2a}^{N2b} \quad (31)$$

$A_{n1,n2} \exp(i\phi_{n1,n2}) \cdot$ $$\exp\left[2\pi i \frac{\sqrt{1+\alpha^2}}{\alpha} \left( \frac{d_2 P_1}{\lambda f_1} l_1 n_1 - \frac{d_1 P_2}{\lambda f_1} l_2 n_2 \right)\right] \cdot$$

$$\exp\left[-2\pi i \frac{\delta_2 f_1 d_1 d_2}{f_2} \frac{\sqrt{1+\alpha^2}}{\alpha} (B_1 w_1 + B_2 w_2 + B_3)\right] \cdot$$

$$\exp\left[-2\pi i \frac{\delta_1 f_1 d_1 d_2}{f_2} \frac{\sqrt{1+\alpha^2}}{\alpha} (B_4 w_2 + B_5)\right] \cdot$$

$$\text{sinc}\left[-\frac{d_1 P_2}{\lambda f_1} \frac{\sqrt{1+\alpha^2}}{\alpha} \left\{ \frac{f_1}{f_2} (B_1 w_1 + B_2 w_2 + B_3) + n_2 \right\}\right] \cdot$$

$$\text{sinc}\left[-\frac{d_2 P_1}{\lambda f_1} \frac{\sqrt{1+\alpha^2}}{\alpha} \left\{ \frac{f_1}{f_2} (B_4 w_2 + B_5) + n_1 \right\}\right]$$

where $$B_1 = \frac{\alpha}{d_1\sqrt{1+\alpha^2}}, B_2 = -\frac{1}{d_1\sqrt{1+\alpha^2}}$$

$$B_3 = \frac{d_1 d_2 \sqrt{1+\alpha^2}}{\alpha} \left\{ \frac{1}{d_1 d_2 \sqrt{1+\alpha^2}} \left( \frac{P_1 l_1}{d_1} + \delta_1 \lambda f_1 \right) - \frac{1}{d_1^2} \left( \frac{P_2 l_2}{d_2} - \delta_2 \lambda f_1 \right) \right\}$$

$$B_4 = -\frac{1}{d_2}$$

$$B_5 = \frac{d_1 d_2 \sqrt{1+\alpha^2}}{\alpha} \left\{ \frac{1}{d_2^2} \left( \frac{P_1 l_1}{d_1} + \delta_1 \lambda f_1 \right) - \frac{1}{d_1 d_2 \sqrt{1+\alpha^2}} \left( \frac{P_2 l_2}{d_2} - \delta_2 \lambda f_1 \right) \right\}$$

$f_2$: the focal length of the Fourier transform lens array optical system $\delta_1, \delta_2$: the amount of shift of the Fourier transform lens array optical system with respect to the array laser where each of $P_1$ and $P_2$ represents the orthogonal distance between the skew lattice axes representing the periodic structure of the lens array.

$P_1$: the orthogonal distance between the axes parallel to Formula (27)

$P_2$: the orthogonal distance between the axes parallel to Formula (28)

The array pitch of the Fourier transform lens array optical system 30' and the variation of the angular spectrum of the laser beam radiated out of each of the laser beam sources 11, 11, . . . of the array laser 10' are set so as to satisfy the relationship of Formulas (32) and (33). Formulas (32) and (33) indicate that the array pitches $P_1$ and $P_2$ in two directions of the Fourier transform lens array optical system 30', which has the periodic structure similar to the reciprocal lattice with respect to the skew lattice pattern of the array laser 10', coincide with integral multiples of the pitches in the corresponding directions of the interference fringes, which are protected onto the Fourier transform plane SA of the Fourier transform lens 20 and have periodic peaks on the reciprocal lattice.

$$\frac{d_2 P_1}{\lambda f_1} \frac{\sqrt{1+\alpha^2}}{\alpha} = I_1 \quad (32)$$

$$\frac{d_1 P_2}{\lambda f_1} \frac{\sqrt{1+\alpha^2}}{\alpha} = I_2 \quad (33)$$

where each of $I_1$ and $I_2$ represents an integer other than 0.

Therefore, Formula (31) can be modified into Formula (34) shown below. The phase differences are set such that $\delta_1=0$ and $\delta_2=0$ by assuming that the interference fringes of the array laser 10' projected onto the Fourier transform plane SA of the Fourier transform lens 20 involve no shift with respect to the Fourier transform lens array optical system 30'.

$$\Psi_2(w_1, w_2) = \frac{\sqrt{1+\alpha^2}}{|\alpha|} P_1 P_2 \sum_{i1=-L1}^{L1} \sum_{i2=-L2}^{L2} \sum_{n1=N1a}^{N1b} \sum_{n2=N2a}^{N2b} \quad (34)$$

$A_{n1,n2} \exp(i\phi_{n1,n2}) \cdot$ $$\text{sinc} \left[ \frac{P_2}{\lambda f_2} \left\{ w_1 - \frac{1}{\alpha} w_2 + \frac{f_2}{f_1} \frac{\sqrt{1+\alpha^2}}{\alpha} d_1 n_2 + \frac{\sqrt{1+\alpha^2}}{\alpha^2} P_1 l_1 - \frac{1+\alpha^2}{\alpha^2} P_2 l_2 \right\} \right] \cdot$$

$$\text{sinc} \left[ \frac{P_1}{\lambda f_2} \frac{\sqrt{1+\alpha^2}}{\alpha} \left\{ w_2 - \frac{f_2}{f_1} d_2 n_1 - \frac{\sqrt{1+\alpha^2}}{\alpha} P_1 l_1 + \frac{1}{\alpha} P_2 l_2 \right\} \right]$$

Such that the near field patterns of the array laser 10' reproduced on the back Fourier transform plane SC (the $w_1-w_2$ coordinate system) may stand in a line at a predetermined pitch in each direction, it is necessary for Formulas (35), (36), and (37) to be satisfied.

$$\frac{f_2}{f_1} d_1 N_1 = P_2 \frac{\sqrt{1+\alpha^2}}{\alpha} \quad (35)$$

$$\frac{f_2}{f_1} d_2 N_2 = P_1 \frac{\sqrt{1+\alpha^2}}{\alpha} \quad (36)$$

$$\alpha = \sqrt{\left( \frac{2\lambda f_1^2}{f_2 d_1 d_2 H} \right)^2 - 1} \quad (37)$$

where H represents an integer.

Formula (37) represents the conditions such that no shift may occur between the adjacent near field patterns of the array laser 10'.

In cases where the laser beam positions in the near field patterns of the array laser 10' reproduced on the back Fourier transform plane SC of the Fourier transform lens array optical system 30' overlap one upon another, it is necessary for the amplification factor (laser beam output power) of each laser beam source 11 to be controlled such that the optical intensity may become uniform as a whole on the back Fourier transform plane SC of the Fourier transform lens array optical system 30'.

Also, such that the intensity distribution of the laser beam radiated out of the Fourier transform lens array optical system 30' may became approximately perfectly single-lobed at the far field, it is necessary to set in Formulas (32) and (33) such that $I_1=1$ and $I_2=1$.

Figure 12:
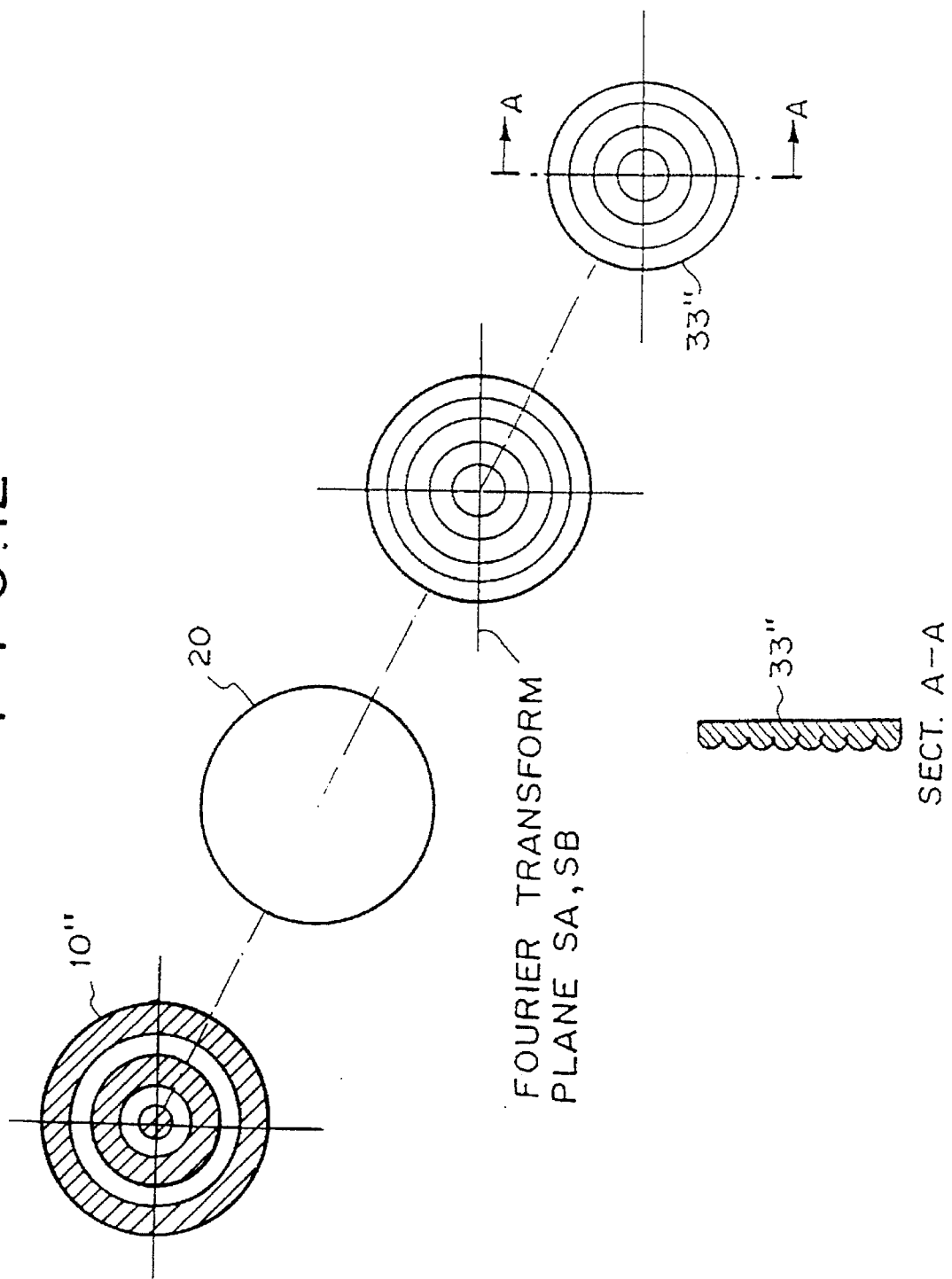
FIG. 12 is a schematic view showing an embodiment of the laser apparatus in accordance with the present invention, wherein an array laser 10'' composed of laser beam sources located in a pattern, which is periodic in a single direction, is used.

The laser beam sources 11, 11, . . . of the array laser need not necessarily be located periodically in each of two different directions in the manner described above. For example, as illustrated in FIG. 12, an array laser 10" may be composed of the laser beam sources located periodically at least in a single direction. In such cases, the far field patterns having a periodic array structure corresponding to the structure of the array laser 10" are formed on the Fourier transform plane SA of the Fourier transform lens 20. A Fourier transform lens array 33" having the structure corresponding to the array structure of the far field patterns is located such that its front Fourier transform plane SB may coincide with the Fourier transform plane SA of the Fourier transform lens 20. In this manner, the near field patterns of the array laser 10" are reproduced sufficiently close to one another as a whole on the back Fourier transform plane SC of the Fourier transform lens array 33". In cases where the near field patterns are thus reproduced sufficiently close to one another, the laser beams having been reflected by the laser resonator mirror optical system can be optically coupled with one another. Therefore, the laser beams having been produced by the array laser can be coherently combined with one another and radiated out.

What is claimed is:

1. A laser apparatus comprising:

i) a laser beam source which emits a plurality of laser beams such that the laser beams at a wavelength may intersect one another with predetermined angular spectra on a predetermined virtual plane, through which the laser beams pass;

ii) a transform optical system including a beam expander array dividing the laser beams having impinged upon said virtual plane into small regions and a Fourier transform lens array which carries out Fourier transforms of the small regions, said transform optical system being located in the vicinity of the virtual plane such that a front Fourier transform plane of said transform optical system substantially coincides with the virtual plane; and iii) a laser resonator mirror optical system including, a) a first laser resonator mirror, which receives the laser beams having been radiated out of said transform optical system, and b) a second laser resonator mirror, which is located at a position rearward from said laser beam source.

2. An apparatus as defined in claim 1, wherein a focal length of said transform optical system, an array pitch of said transform optical system, a number of the plurality of said laser beams emitted by said laser beam source, the wavelength of the laser beams, and a variation of an angular spectrum of each of the laser beams at the respective positions at which the laser beams intersect one another, are set such that the plurality of Fourier transformed patterns of the laser beams are reproduced on the Fourier transform plane of said transform optical system at equal intervals and with the same phase.

3. An apparatus as defined in claim 2, wherein a product of an array pitch of said transform optical system and variation of the angular spectrum of each of the laser beams at the respective positions at which the laser beams intersect one another, is set to be equal to 1, such that an intensity distribution pattern of the combined laser beam, which occurs from optical coupling of the plurality of the laser beams, by said transform optical system, and said laser resonator mirror optical system becomes substantially single-lobed.

4. An apparatus as defined in claim 2, wherein a product of the array pitch of said transform optical system and the variation of the angular spectrum of each of the laser beams is set to be within the range of larger than 0 to smaller than 2 and which is other than 1, and the laser apparatus further comprises phase correcting means for correcting each of the phases of the laser beams passing through said Fourier transform lens array such that the wave fronts of the laser beams after having passed through said Fourier transform lens array are continuously smoothly connected with one another, whereby the intensity distribution pattern of the combined laser beam, which occurs from optical coupling of the plurality of the laser beams by said transform optical system, becomes substantially single-lobed.

5. An apparatus as defined in claim 2, wherein said plurality of Fourier transformed patterns are reproduced at equal intervals and with a same phase with respect to a predetermined direction by providing elements of the apparatus which satisfy the following equations:

$$I = p \Delta \alpha$$

$$p = \lambda \Delta \alpha f_2 N$$

where I is an integer other than 0, p is the lens pitch of the transform optical system, $\lambda$ is the wavelength of the laser beam source, $\Delta \alpha$ is the variation in angular spectrum, $f_2$ is the focal length of the transform optical system and N is the number of laser beams.

6. An apparatus as defined in claim 5, wherein said apparatus further comprises a Fourier transform lens situated between said laser beam source and said transform optical system, and wherein said laser beam source is an array of laser beam sources, and wherein said variation in angular spectrum is defined as $$\Delta \alpha = \frac{d_1}{\lambda f_1},$$

where $f_1$ is a focal length of said Fourier transform lens and $d_1$ is an array pitch of said array of laser beam sources.

7. An apparatus as defined in claim 1, wherein said laser beam source includes a plurality of laser beam sources arranged in a skew lattice pattern in a plane normal to the optical axis, and said Fourier transform lens array constituting said transform optical system is arrayed in a lattice pattern reciprocal with said skew lattice pattern of said plurality of laser beam sources.

8. A method of combining laser beams such that a plurality of Fourier transformed patterns of the laser beams are reproduced on a front Fourier transform plane of a transform optical system at equal intervals and with the same phase, comprising the steps of:

emitting a plurality of laser beams at a wavelength;

intersecting the laser beams with one another with predetermined angular spectra on a predetermined virtual plane through which the laser beams pass;

dividing the laser beams having impinged upon the virtual plane into small regions using a beam expander array;

Fourier transforming the small regions using the Fourier transform lens array;

locating the transform optical system including the beam expander array and the Fourier transform lens array in the vicinity of the virtual plane such that the front Fourier transform plane of said transform optical system substantially coincides with the virtual plane;

reflecting the laser beams back towards the transform optical system; and positioning a laser resonator mirror rearward from said laser beam source.

* * * * *